(12) United States Patent
Lo

(10) Patent No.: US 10,361,721 B1
(45) Date of Patent: Jul. 23, 2019

(54) METHODS AND NETWORK DEVICE FOR UNCODED BIT PROTECTION IN 10GBASE-T ETHERNET

(71) Applicant: Marvell International Ltd., Hamilton (BM)

(72) Inventor: William Lo, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 226 days.

(21) Appl. No.: 14/702,485

(22) Filed: May 1, 2015

Related U.S. Application Data

(60) Provisional application No. 61/987,157, filed on May 1, 2014.

(51) Int. Cl.
*H03M 13/00* (2006.01)
*H03M 13/11* (2006.01)
*H04L 1/00* (2006.01)

(52) U.S. Cl.
CPC ...... *H03M 13/1105* (2013.01); *H03M 13/611* (2013.01); *H04L 1/0045* (2013.01)

(58) Field of Classification Search
CPC .. H03M 13/09; H03M 13/091; H03M 13/353; H03M 13/35; H04L 1/0061; H04L 1/0057; H04L 1/0045; H04L 12/46; H04L 12/4625; H04L 12/6418; H04L 67/1097; G06F 11/1068; G06F 3/064; G06F 3/0679; G06F 3/0619; G06F 11/1044; G06F 12/0253; G06F 9/52; G06F 11/108; G06F 11/10; G06F 2212/2022; G06F 2211/109; G11C 29/52

USPC ........................................................ 714/758
See application file for complete search history.

(56) References Cited

U.S. PATENT DOCUMENTS

| | | | |
|---|---|---|---|
| 5,448,592 A | 9/1995 | Williams et al. | |
| 6,362,757 B1 | 3/2002 | Lee et al. | |
| 6,470,470 B2 | 10/2002 | Jarvinen et al. | |
| 6,476,737 B1 | 11/2002 | Caroselli et al. | |
| 6,504,493 B1 | 1/2003 | Burd | |
| 6,633,840 B1 * | 10/2003 | Bonnard ............... | H04W 76/20 704/229 |
| 6,813,651 B1 | 11/2004 | Smith et al. | |
| 7,062,703 B1 | 6/2006 | Keaney et al. | |
| 7,251,699 B1 | 7/2007 | Lo | |

(Continued)

OTHER PUBLICATIONS

"IEEE Standard for Ethernet, Section Four," IEEE Std. 802.3-2012, *The Institute for Electrical and Electronics Engineers*, pp. 1-732 (2012).

(Continued)

*Primary Examiner* — Samir W Rizk
*Assistant Examiner* — Enam Ahmed

(57) ABSTRACT

A plurality of bits are received, and the plurality of bits are grouped and transcoded into a plurality of bit blocks, where the plurality of bit blocks includes a first set of bit blocks and a second set of bit blocks. A set of transcoded bit blocks is generated by transcoding the first set of bit blocks, where the set of transcoded bit blocks contains fewer bits than the first set of bit blocks. An aggregated bit block is generated at least by aggregating the set of transcoded bit blocks and the second set of bit blocks. All bits in the aggregated bit block are encoded, and the encoded bits in the aggregated bit block are modulated to generate a communication frame.

30 Claims, 12 Drawing Sheets

(56) References Cited

U.S. PATENT DOCUMENTS

| | | | |
|---|---|---|---|
| 7,657,821 B1* | 2/2010 | Wakerly | H03M 13/09 714/758 |
| 8,443,255 B2* | 5/2013 | Jiang | H03M 13/1111 714/758 |
| 8,689,089 B2* | 4/2014 | Wang | H04L 1/0041 714/776 |
| 8,861,585 B2* | 10/2014 | Subramanian | H04N 21/6131 348/387.1 |
| 8,935,595 B2 | 1/2015 | Zhong et al. | |
| 9,363,039 B1 | 6/2016 | Farjadrad et al. | |
| 9,461,941 B2 | 10/2016 | Mehta et al. | |
| 9,774,420 B1* | 9/2017 | Langner | H04L 1/0041 |
| 2001/0034729 A1 | 10/2001 | Azadet et al. | |
| 2002/0057661 A1 | 5/2002 | Raith | |
| 2003/0147654 A1 | 8/2003 | Sung et al. | |
| 2003/0187994 A1 | 10/2003 | Jackson et al. | |
| 2005/0141747 A1* | 6/2005 | Shi | G06T 1/0028 382/100 |
| 2006/0045197 A1* | 3/2006 | Ungerboeck | H03M 13/11 375/261 |
| 2006/0218459 A1 | 9/2006 | Hedberg | |
| 2008/0082896 A1 | 4/2008 | Valliappan et al. | |
| 2010/0095185 A1* | 4/2010 | Ganga | H03M 13/33 714/758 |
| 2010/0098413 A1 | 4/2010 | Li et al. | |
| 2010/0306629 A1 | 12/2010 | Kovesi et al. | |
| 2011/0126074 A1* | 5/2011 | Calderon | H04L 1/0057 714/752 |
| 2012/0179949 A1* | 7/2012 | Wang | H04L 1/0041 714/752 |
| 2013/0166986 A1* | 6/2013 | Alrod | G06F 11/1048 714/755 |
| 2013/0305127 A1* | 11/2013 | Kim | H04L 1/0057 714/785 |
| 2013/0346823 A1* | 12/2013 | Cideciyan | H03M 13/13 714/752 |
| 2015/0341277 A1* | 11/2015 | Gravel | H04L 47/25 370/468 |

OTHER PUBLICATIONS

"IEEE Stadard for Ethernet ,Amendment 2: Physical Layer Specifications and Management Parameters for 100 Gb/s Operation Over Backplanes and Copper Cables." IEEE Std. 802.3bj™—2014. *The Institute for Electrical and Electronics Engineers*, 368 pages (Jun. 12, 2014).

U.S. Appl. No. 15/419,628, Lo, "Methods and Network Device for Uncoded Bit Protection in 10GBASE-T Ethernet," filed Jan. 30, 2017.

Notice of Allowance in U.S. Appl. No. 15/419,628, dated Sep. 20, 2018 (10 pages).

Office Action in U.S. Appl. No. 15,419,628, dated Jun. 16, 2017 (15 pages).

Office Action in U.S. Appl. No. 15,419,628, dated Oct. 19, 2017 (11 pages).

Notice of Allowance in U.S. Appl. No. 15,419,628, dated Feb. 9, 2018 (13 pages).

Office Action in U.S. Appl. No. 15,419,628, dated Apr. 25, 2018 (13 pages).

\* cited by examiner

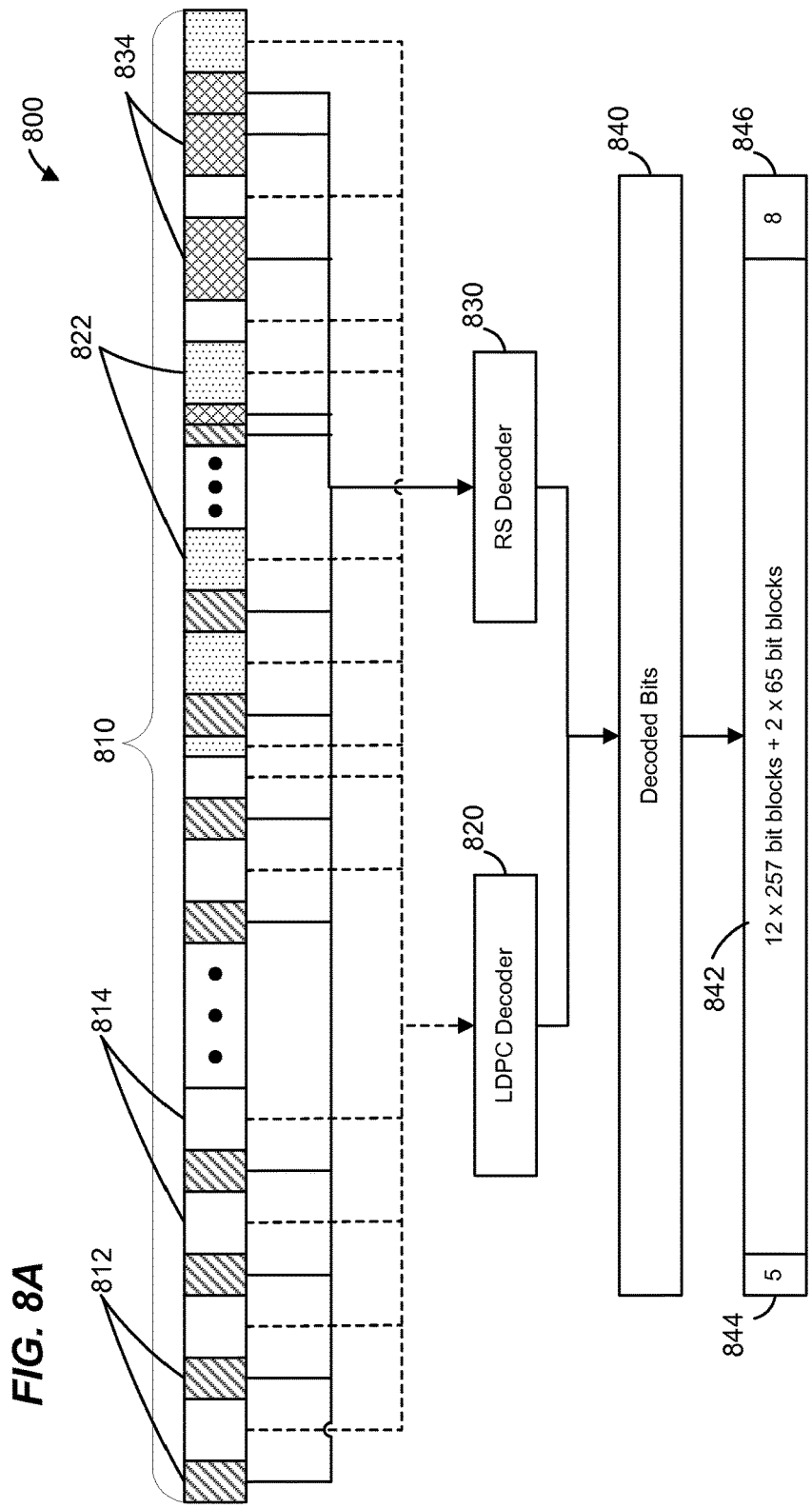

METHODS AND NETWORK DEVICE FOR UNCODED BIT PROTECTION IN 10GBASE-T ETHERNET

CROSS-REFERENCES TO RELATED APPLICATIONS

This application claims the benefit of U.S. Provisional Patent Application No. 61/987,157, entitled "10GBASE-T Uncoded Bit Protection," filed on May 1, 2014, the disclosure of which is incorporated herein by reference in its entirety.

FIELD OF THE DISCLOSURE

The present disclosure is related generally to communication networks and, more particularly, to generation of communication frames using error correction encoding.

BACKGROUND

Ten Gigabit Ethernet, as defined by the Institute of Electrical and Electronics Engineers (IEEE) 802.3 standard, is designed to transmit Ethernet frames at a rate of 10 gigabits per second. Ten Gigabit Ethernet utilizes physical layer (PHY) entities such as 10GBASE-T. A 10GBASE-T PHY entity is coupled to an IEEE 802.3 Media Access Control (MAC) sublayer through a 10 Gigabit Media Independent Interface (XGMII).

In operation, a conventional 10GBASE-T PHY entity receives eight XGMII data octets provided by two consecutive transfers on the XGMII. The eight XGMII data octets are grouped into 64-bit blocks. The conventional 10GBASE-T PHY entity then encodes each group of eight XGMII data octets, along with data/control indications, into a 65-bit block via a 64b/65b encoding scheme. The resultant 65-bit blocks are scrambled and aggregated into a group of 50 65-bit blocks. The conventional 10GBASE-T PHY then adds 8 cyclic redundancy check (CRC) bits to the group of 50 65-bit blocks to yield a CRC-checked payload of 50×65+8=3258 bits. An auxiliary channel bit is added to the payload to yield a block of 3259 bits.

The conventional 10GBASE-T PHY entity is designed to protect only certain bits in the payload with error correction encoding. The 3259 bits are divided into i) 1723 bits and ii) 3×512=1536 bits. The conventional 10GBASE-T PHY entity encodes the 1723 bits using a low-density parity-check code (LDPC) encoder, which adds 325 LDPC parity bits to the 1723 bits to form an LDPC codeword of 2048 coded bits (represented by LDPC (1723, 2048)). However, the 3×512=1536 bits, which includes the auxiliary channel bit, remain uncoded. The conventional 10GBASE-T PHY entity arranges the 1536=3×512 uncoded bits and the 2048=4×512 coded bits (3854 total bits) in a frame of 512 7-bit labels, where each 7-bit label contains 3 uncoded bits and 4 coded bits. The conventional 10GBASE-T PHY entity then maps the 512 7-bit labels into 512 two-dimensional (2D) modulation symbols selected from a double square 128 (DSQ128) constellation, which is a constrained constellation of 128 maximally spaced 2D symbols.

SUMMARY

In an embodiment, a method for generating a frame in a network interface device includes receiving, at the network interface device, a plurality of bits. The method includes grouping and encoding, at the network interface device, the plurality of bits into a plurality of bit blocks, where the plurality of bit blocks includes a first set of bit blocks and a second set of bit blocks. The method also includes generating, at the network interface device, a set of transcoded bit blocks by transcoding the first set of bit blocks, where the set of transcoded bit blocks contains fewer bits than the first set of bit blocks. The method includes generating, at the network interface device, an aggregated bit block at least by aggregating the set of transcoded bit blocks and the second set of bit blocks. The method further includes encoding, at the network interface device, all bits in the aggregated bit block, and modulating, at the network interface device, the encoded bits in the aggregated bit block to generate the frame.

In another embodiment, encoding all bits in the aggregated bit block includes: encoding a portion of the bits in the aggregated bit block using a first encoder to generate a set of first parity bits; and encoding a remaining portion of the bits in the aggregated bit block using a second encoder to generate a set of second parity bits.

In other embodiments, the first encoder is a low-density parity-check code (LDPC) encoder and the first parity bits are LDPC parity bits; and the second encoder is a Reed-Solomon (RS) encoder and the second parity bits are RS parity bits.

In an embodiment, the first set of bit blocks includes a plurality of subsets of bit blocks, and transcoding the first set of bit blocks includes transcoding each subset of bit blocks into a transcoded bit block.

In yet another embodiment, a subset of bit blocks includes a plurality of payload bits and a plurality of header bits, and a transcoded bit block of the subset of bit blocks includes the plurality of payload bits and one header bit.

In still another embodiment, the one header bit of the transcoded bit block is an indicator of whether the plurality of payload bits in the transcoded bit block are data bits or control bits.

The method further includes scrambling, at the network interface, the bits in the aggregated bit block before encoding the bits in the aggregated bit block.

The method further includes adding, at the network interface, at least one padding bit to the aggregated bit block before the encoding the bits in the aggregated bit block.

The method further includes adding, at the network interface, cyclic redundancy check bits to the aggregated bit block before encoding the bits in the aggregated bit block.

In an embodiment, modulating the encoded bits in the aggregated bit block includes mapping, at the network interface, the encoded bits into a plurality of modulation symbols selected from a double squared (DSQ128) constellation.

In another embodiment, a network interface device includes a physical layer (PHY) processing device. The PHY processing device is configured to receive a plurality of bits. The PHY processing device is also configured to group and encode the plurality of bits into a plurality of bit blocks, where the plurality of bit blocks includes a first set of bit blocks and a second set of bit blocks. The PHY processing device is configured to generate a set of transcoded bit blocks by transcoding the first set of bit blocks, where the set of transcoded bit blocks contains fewer bits than the first set of bit blocks. The PHY processing device is configured to generate an aggregated bit block at least by aggregating the set of transcoded bit blocks and the second set of bit blocks. The PHY processing device is configured to encode all bits in the aggregated bit block, and modulate the encoded bits in the aggregated bit block to generate a frame.

In an embodiment, the PHY processing device is configured to encode a portion of the bits in the aggregated bit block using a first encoder to generate a set of first parity bits, and encode a remaining portion of the bits in the aggregated bit block using a second encoder to generate a set of second parity bits.

In other embodiments, the first encoder is a LDPC encoder and the first parity bits are LDPC parity bits; and the second encoder is a RS encoder and the second parity bits are RS parity bits.

In still another embodiment, the first set of bit blocks includes a plurality of subsets of bit blocks, and transcoding the first set of bit blocks includes transcoding each subset of bit blocks into a transcoded bit block.

In an embodiment, a subset of bit blocks includes a plurality of payload bits and a plurality of header bits, and a transcoded bit block of the subset of bit blocks includes the plurality of payload bits and one header bit.

In another embodiment, the one header bit of the transcoded bit block is an indicator of whether the plurality of payload bits in the transcoded bit block are data bits or control bits.

The PHY processing device is further configured to scramble the bits in the aggregated bit block before the bits in the aggregated bit block are encoded.

The PHY processing device is further configured to add at least one padding bit to the aggregated bit block before the bits in the aggregated bit block are encoded.

The PHY processing device is further configured to add cyclic redundancy check bits to the aggregated bit block before the bits in the aggregated bit block are encoded.

In an embodiment, the PHY processing device is configured to modulate the encoded bits in the aggregated bit block by mapping the encoded bits into a plurality of modulation symbols selected from a DSQ128 constellation.

In an embodiment, the network interface device of claim further includes a media access control layer (MAC) processing device, and the MAC processing device is configured to provide the plurality of bits to the PHY processing device.

In another embodiment, a method for generating a frame in a network interface device includes receiving, at the network interface device, a plurality of bits. The method includes grouping and encoding, at the network interface device, the plurality of bits into fifty 65-bit blocks, where each 65-bit block includes one header bit and 64 payload bits. The method also includes transcoding, at the network interface device, forty-eight of the fifty 65-bit blocks into twelve 257-bit blocks, where each 257-bit block is generated by (i) aggregating four 65-bit blocks, and (ii) transcoding the aggregated four 65-bit blocks into a 257-bit block, wherein the 257-bit block comprises one header bit and 256 payload bits. The method includes aggregating, at the network interface device, the twelve 257-bit blocks and two remaining 65-bit blocks to generate an aggregated bit block. The method further includes encoding, at the network interface device, all bits in the aggregated bit block, and modulating, at the network interface device, the encoded bits in the aggregated bit block to generate the frame.

In other embodiments, encoding all bits in the aggregated bit block includes encode a portion of the bits in the aggregated bit block using a LDPC encoder to generate a set of LDPC parity bits; and encode a remaining portion of the bits in the aggregated bit block using a RS encoder to generate a set of RS parity bits.

In an embodiment, modulating the encoded bits in the aggregated bit block includes mapping the encoded bits in the aggregated bit block, the LDPC parity bits, and the RS parity bits into a plurality of modulation symbols selected from a DSQ128 constellation.

The method further includes scrambling, at the network interface device, the bits in the aggregated bit block before the bits in the aggregated bit block are encoded.

The method further includes adding, at the network interface device, at least one padding bit to the aggregated bit block before the bits in the aggregated bit block are encoded.

The method further includes adding, at the network interface device, cyclic redundancy check bits to the aggregated bit block before the bits in the aggregated bit block are encoded.

In an embodiment, a network interface device includes PHY processing device. The PHY processing device is configured to receive a plurality of bits. The PHY processing device is configured to group and encode the plurality of bits into fifty 65-bit blocks, where each 65-bit block includes one header bit and 64 payload bits. The PHY processing device is also configured to transcode forty-eight of the fifty 65-bit blocks into twelve 257-bit blocks, where each 257-bit block is generated by (i) aggregating four 65-bit blocks, and (ii) transcoding the aggregated four 65-bit blocks into a 257-bit block, wherein the 257-bit block includes one header bit and 256 payload bits. The PHY processing device is further configured to aggregate the twelve 257-bit block and two remaining 65-bit blocks to generate an aggregated bit block. The PHY processing device is configured to encode all bits in the aggregated bit block, and modulate the encoded bits in the aggregated bit block to generate a frame.

In another embodiment, the PHY processing device is configured to encode all bits in the aggregated bit block by encoding a portion of the bits in the aggregated bit block using a LDPC encoder to generate a set of LDPC parity bits, and encoding a remaining portion of the bits in the aggregated bit block using a RS encoder to generate a set of RS parity bits.

In still another embodiment, the PHY processing device is configured to modulate the encoded bits by mapping the encoded bits in the aggregated bit block, the LDPC parity bits, and the RS parity bits into a plurality of modulation symbols selected from a DSQ128 constellation.

The PHY processing device is further configured to scramble the bits in the aggregated bit block before the bits in the aggregated bit block are encoded.

The PHY processing device is further configured to add at least one padding bit to the aggregated bit block before the bits in the aggregated bit block are encoded.

The PHY processing device is further configured to add cyclic redundancy check bits to the aggregated bit block before the bits in the aggregated bit block are encoded.

In yet another embodiment, the network interface device further includes a MAC processing device, and the MAC processing device is configured to provide the plurality of bits to the PHY processing device.

BRIEF DESCRIPTION OF THE DRAWINGS

FIG. 8A is a diagram of an example decoding technique, according to an embodiment.

DETAILED DESCRIPTION

In a conventional 10GBASE-T PHY entity, only the 1723 coded bits, which are encoded by a LDPC encoder with 325 LDPC parity bits, are protected from errors by error correction encoding. The remaining 1536 uncoded bits are not error correction encoded and thus are not protected from errors. Poor channel conditions can cause bit errors in both the coded bits and the uncoded bits. Bit errors in the 1723 coded bits can be corrected by the LDPC. However, bit errors in the 1536 uncoded bits cannot be corrected.

In embodiments described below, however, a network interface device (e.g., which is included in a communication device such as an endpoint device (e.g., a server, a desktop computer, a laptop computer, etc.) or an intermediate network device (e.g., a network switch, a network bridge, a network hub, a network router, etc.) or other suitable network device) provides error protection to bits that would remain uncoded in conventional 10GBASE-T. According to various embodiments, a network interface device provides protection to the previously-uncoded bits in conjunction with any suitable combination of one or more of the following features: i) more bits are not added to the frame as compared to conventional 10GBASE-T, ii) the same LDPC encoding scheme as a used in 10GBASE-T is utilized, iii) the same DSQ128 modulation scheme as 10GBASE-T is utilized, and/or iv) the same baud rate as 10GBASE-T is utilized.

Figure 1:
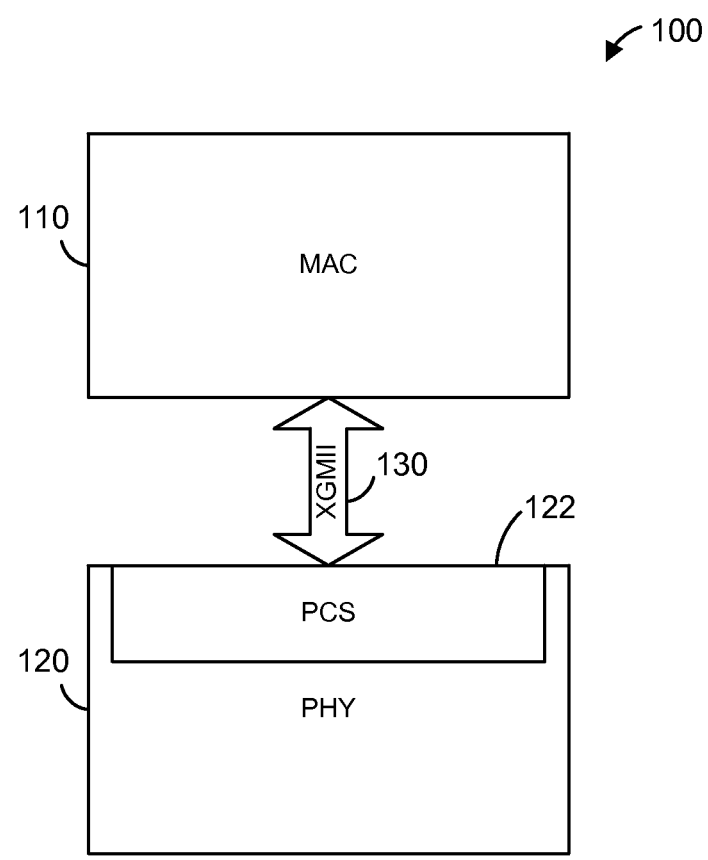
FIG. 1 is a block diagram of an example network interface device, according to an embodiment.

FIG. 1 is a block diagram of an example network interface device 100, according to an embodiment. The network interface device 100 is an Ethernet switch, an Ethernet hub, an Ethernet router, or other suitable network interface device configured to operate within a networked environment, in various embodiments. The network interface device includes at least a media access control (MAC) processing device 110 and a physical layer (PHY) processing device 120. In an embodiment, the MAC processing device 110 is compliant with the IEEE 802.3 10 Gigabit Ethernet Standard. In other embodiments, the MAC processing device 110 is compliant with another suitable communication protocol. The MAC processing device 110 is communicatively coupled to the PHY processing device 120 through a 10 Gigabit Media Independent Interface (XGMII) 130, according to an embodiment. In other embodiments, the MAC processing device 110 is communicatively coupled to the PHY processing device 120 via another suitable communication interface. The PHY processing device 120 is configured to implement physical coding sublayer (PCS) processing 122. In an embodiment, the PCS processing 122 is implemented as a PCS processing device 122 included in the PHY processing device 120. In an embodiment, the PHY processing device 120 is responsible for at least receiving bits provided by the MAC processing device 100, transcoding the received bits, scrambling the transcoded bits, and modulating the bits to generate an Ethernet frame that is compatible with the IEEE 802.3 Standard. In some embodiments, some or all of these functions are performed by the PCS processing 122 portion of the PHY processing device 120.

In various embodiments, the PHY processing device 120 is configured to receive a plurality of bits by the MAC processing device 100 through the XGMII 130. The plurality of bits includes, in an embodiment, sets of eight XGMII data octets provided by two consecutive transfers via the XGMII. The PHY processing device 120 is also configured to group and encode the received plurality of bits into a plurality of bit blocks. The sets of eight XGMII data octets are grouped and encoded using a 64b/65b transcoding scheme into fifty (50) 65-bit blocks, according to an embodiment. The plurality of bit blocks includes a first set of bit blocks (e.g., forty-eight (48) of the fifty 65-bit blocks) and a second set of bit blocks (e.g., two (2) remaining 65-bit blocks of the fifty 65-bit blocks), according to an embodiment.

Furthermore, the PHY processing device 120 is configured to generate a set of transcoded bit blocks by transcoding the first set of bit blocks, where the set of transcoded bit blocks contains fewer bits than the first set of bit blocks. In an embodiment, the forty-eight 65-bit blocks (the first set of bit blocks) are transcoded using a 256b/257b transcoding scheme into a set of twelve 257-bit blocks (the set of transcoded bit blocks). When aggregated, the four 65-bit blocks contains 4×65=260 bits. On the other hand, each of the twelve transcoded bit blocks only contains 257-bits. Thus, transcoding the forty-eight 65-bit blocks into twelve 256-bit blocks yields net 36 bits available for use as parity bits. An example 256b/257b transcoding scheme that is used in some embodiments is described in more detail below with reference to FIG. 4.

The PHY processing device 120 is configured to generate an aggregated bit block at least by aggregating the set of transcoded bit blocks and the second set of bit blocks. In an embodiment, the twelve 257-bit blocks (the set of transcoded bit blocks) and the two remaining 65-bit blocks (the second set of bit blocks) are aggregated together to form an aggregated bit block. Then, the PHY processing device 120 is configured to encode all bits in the aggregated bit block, and modulate the encoded bits in the aggregated bit block to generate a frame.

In an embodiment, before the bits in the aggregated bit block are encoded, the PHY processing device 120 is configured to scramble the bits in the aggregated bit block.

In another embodiment, the PHY processing device 120 is configured to add at least one padding bit to the aggregated bit block before the bits in the aggregated bit block are encoded. In yet another embodiment, the PHY processing device 120 is configured to add at least one padding bit and cyclic redundancy check (CRC) bits to the aggregated bit block before the bits in the aggregated bit block are encoded.

To encode the bits in the aggregated bit block, the PHY processing device 120 is configured to encode a portion of the bits in the aggregated bit block using a first encoder to generate a set of first parity bits, and encode a remaining portion of the bits in the aggregated bit block using a second encoder to generate a set of second parity bits. In an embodiment, the PHY processing device 120 utilizes an LDPC encoder, the same LDPC encoder used in 10GBASE-T, to encode 1723 bits in the aggregated bit block. In other embodiments, another suitable encoder is utilized (e.g., another suitable LDPC encoder). The LDPC encoder generates 325 LDPC parity bits for correcting errors in the 1723 LDPC encoded bits. The PHY processing device 120 utilizes a Reed-Solomon (RS) encoder to encode the remaining portion of the bits in the aggregated bit block, according to an embodiment. In other embodiments, another suitable encoder other than an RS encoder is utilized. The RS encoder then generates RS parity bits for correcting errors in the RS encoded bits.

In an embodiment, the PHY processing device 120 is configured to add at least one padding bit (e.g., 5 padding bits) and CRC bits (e.g., 8 CRC bits) to the aggregated bit block before encoding. Then, 1723 bits are encoded using the LDPC encoder and 1504 bits are encoded with the RS encoder. The RS encoder generates 32 RS parity bits, which can correct two 8-bit symbols.

In another embodiment, the PHY processing device 120 is configured to add at least one padding bit (e.g., 5 padding bits) to the aggregated bit block before encoding without adding any CRC bits. In this case, 1723 bits are encoded using the LDPC encoder and 1496 bits are encoded with the RS encoder. The RS encoder generates 40 RS parity bits, which can correct two 8-bit symbols.

After encoding, the PHY processing device 120 is configured to modulate the encoded bits in the aggregated bit block, plus the parity bits, to generate a frame. The encoded bits and the parity bits are mapped into a plurality of modulation symbols selected from a double squared 128 (DSQ128) constellation. In an embodiment, the PHY processing device 120 is configured to modulate the encoded bits plus the LDPC parity bits and RS parity bits (a total of 3584 bits), by mapping them into 512 DSQ128 symbols. In other words, the PHY processing device 120 is configured to generate a frame having the same number of total bits as a conventional 10GBASE-T PHY entity and to modulate the bits using the same DSQ128 modulation scheme that is used in 10GBASE-T. In other embodiments, the total number of bits is different than provided by a conventional 10GBASE-T PHY entity and/or a suitable modulation scheme other than DSQ128 is utilized. In an embodiment, the PHY processing device 120 is configured to map encoded bits and parity bits such that i) LDPC encoded bits select a constellation point from among a cluster (e.g., a 4×4 cluster) of adjacent constellation points, and ii) RS encoded bits select one cluster from among a set of different clusters (e.g., eight clusters) of constellation points. Accordingly, different constellation points corresponding to different values of a bit within the RS encoded bits are located in different clusters, whereas different constellation points corresponding to different values of a bit within the LDPC encoded bits are located within a single cluster. Because different constellation points corresponding to different values of a bit within the RS encoded bits are located in different clusters, the distance between two such constellation points tends to be larger than a distance between different constellation points corresponding to different values of a bit within the LDPC encoded bits, which are located within a single cluster. Because the distance between different constellation points corresponding to different values of a bit within the RS encoded bits tends to be larger than the distance between two constellation points corresponding to different values of a bit within the LDPC encoded bits, the RS encoded bits are less prone to errors than the LDPC encoded bits when transmitted over a communication link.

Figure 2A:
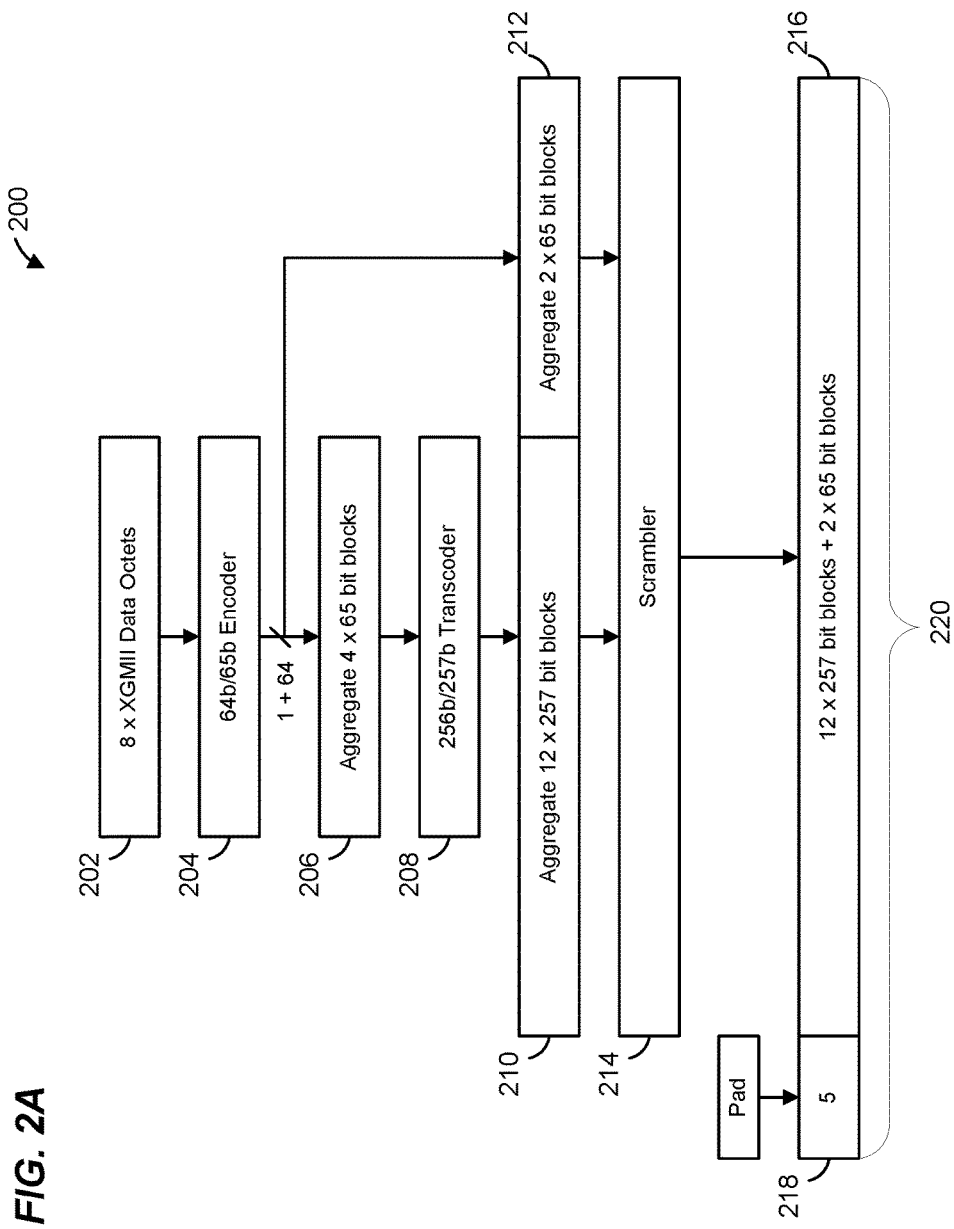
FIG. 2A is a diagram of an example compacting technique, according to an embodiment.

FIG. 2A is a diagram of an example compaction technique 200, according to an embodiment. In some embodiments, the compaction technique 200 is implemented by the PHY processing device 120 in the network interface device 100 of FIG. 1, and FIG. 2A is described with reference to FIG. 1 for explanatory purposes. In other embodiments, however, the compaction technique 200 is implemented by another suitable network interface device.

According to the compaction technique 200, the PHY processing device 120 receives eight XGMII data octets 202, provided by the XGMII via two consecutive transfers. The PHY processing device 120 groups the eight XGMII data octets 202 into a 64-bit block. The PHY processing device 120 is configured to transcode encode each group of eight XGMII data octets 202, along with data/control indications, into a 65-bit block using a 64b/65b encoder 204. The resultant 65-bit block contains one header bit and 64 payload bits. The header bit is an indicator of whether the 65-bit block is a data block or a control block. For example, in 10GBASE-T, the header bit is 0 when the 65-bit block is a data block, and the header bit is 1 when the 65-bit block is a control block. In an embodiment, fifty (50) 65-bit blocks are generated.

The PHY processing device 120 is configured to aggregate four (4) 65-bit blocks. Then the PHY processing device 120 is configured to transcode the aggregated four 65-bit blocks 206 into one 257-bit block using a 256b/257b transcoder 208. An example 256b/257b transcoding scheme that is used in some embodiments is described in more detail below with reference to FIG. 4. The aggregated four 65-bit blocks 206 contains 4×65=260 bits. After transcoding, the 260 bits are reduced to only 257 bits, including one header bit and 256 payload bits. Thus, transcoding the aggregated four 65-bit blocks 206 into one 257-bit block yields net 3 bits. Furthermore, the PHY processing device 120 is configured to transcode a total of forty-eight (48) of the fifty 65-bit blocks into twelve (12) 257-bit blocks 210. The PHY processing device 120 is configured to aggregate the twelve 257-bit blocks 210 and the two (2) remaining 65-bit blocks 212 to form an aggregated bit block. Compared to aggregating the fifty 65-bit blocks without 256b/257b transcoding as is done in 10GBASE-T, the transcoding technique 200 yields net 36 bits available for use as parity bits.

The PHY processing device 120 is configured to scramble the bits in the aggregated bit block 216 using a scrambler 214. Then, the PHY processing device 120 is configured to add five (5) padding bits 218 to the aggregated bit block 218 to generate a padded bit block 220. The five padding bits 218 are randomized. Although five padding bits 218 are added to the aggregated bit block 216 in the present embodiment, in other embodiments, a number of padding bits fewer than or more than five (e.g., one, two, three, four, six, etc.) can be used.

Figure 2B:
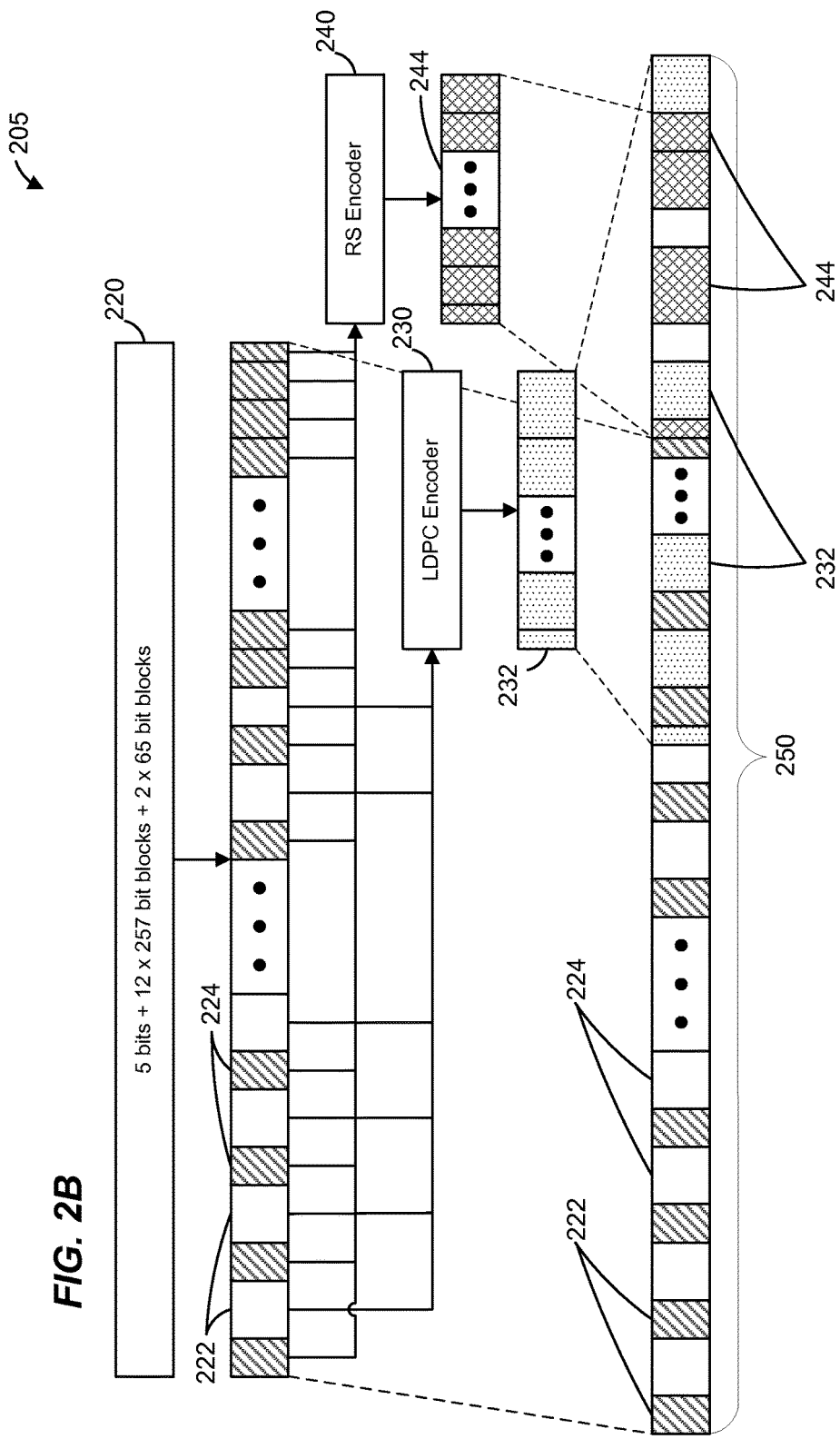
FIG. 2B is a diagram of an example encoding technique, according to an embodiment.

FIG. 2B is a diagram of an example encoding technique 205, according to an embodiment. In some embodiments, the data encoding technique 205 is implemented by the PHY processing device 120 in the network interface device 100 of FIG. 1, and FIG. 2B is described with reference to FIG. 1 for explanatory purposes. In other embodiments, however, the encoding technique 205 is implemented by another suitable network interface device. The encoding technique 205 follows the compaction technique 200 of FIG. 2A. The PHY processing device 120 is configured to use the compaction technique 200 in combination with the encoding technique 205 to generate a frame.

The bits in the padded bit block 220 are divided into a set of bits 222 and a set of bits 224. The set of bits 222 includes 1723 bits, and the set of bits 224 includes 1496 bits. The PHY processing device 120 is configured to encode bits 222 using a LDPC encoder 230, which generates LDPC parity bits 232. In an embodiment, the LDPC encoder 230 is the same as the LDPC encoder used in 10GBASE-T, in which 325 LDPC parity bits are generated. Furthermore, the PHY processing device 120 is configured to encode bits 224 using an RS encoder 240, which generates RS parity bits 244. Then, the PHY processing device 120 is configured to arrange bits 222, bits 224, LDPC parity bits 232 and RS parity bits 244 into a frame 250. The RS parity bits 244 are placed in slots that would have been used by uncoded bits in conventional 10GBASE-T, according to an embodiment. However, the compaction technique 200 reduces the number of bits in the padded bit block 220, which make these slots that would otherwise be used for padding (in the conventional 10GBASE-T) available for the RS parity bits without increasing the total number of bits in the frame 250.

In an embodiment, the PHY processing device 120 is configured to modulate the bits in the frame 250. The PHY processing device 120 is configured to modulate the bits in the frame 250 (3584 total bits), by mapping them into 512 DSQ128 symbols. The PHY processing device 120 according to an embodiment is configured to modulate the bits in the frame 250 using the same DSQ128 modulation scheme that is used in conventional 10GBASE-T. In an embodiment, the PHY processing device 120 is configured to map encoded bits and parity bits such that i) LDPC encoded bits select a constellation point from among a cluster (e.g., a 4×4 cluster) of adjacent constellation points, and ii) RS encoded bits select one cluster from among a set of different clusters (e.g., eight clusters) of constellation points. Accordingly, the PHY processing device 120 is configured map encoded bits and parity bits such that the RS encoded bits are less prone to errors than the LDPC encoded bits when transmitted over a communication link.

Figure 3A:
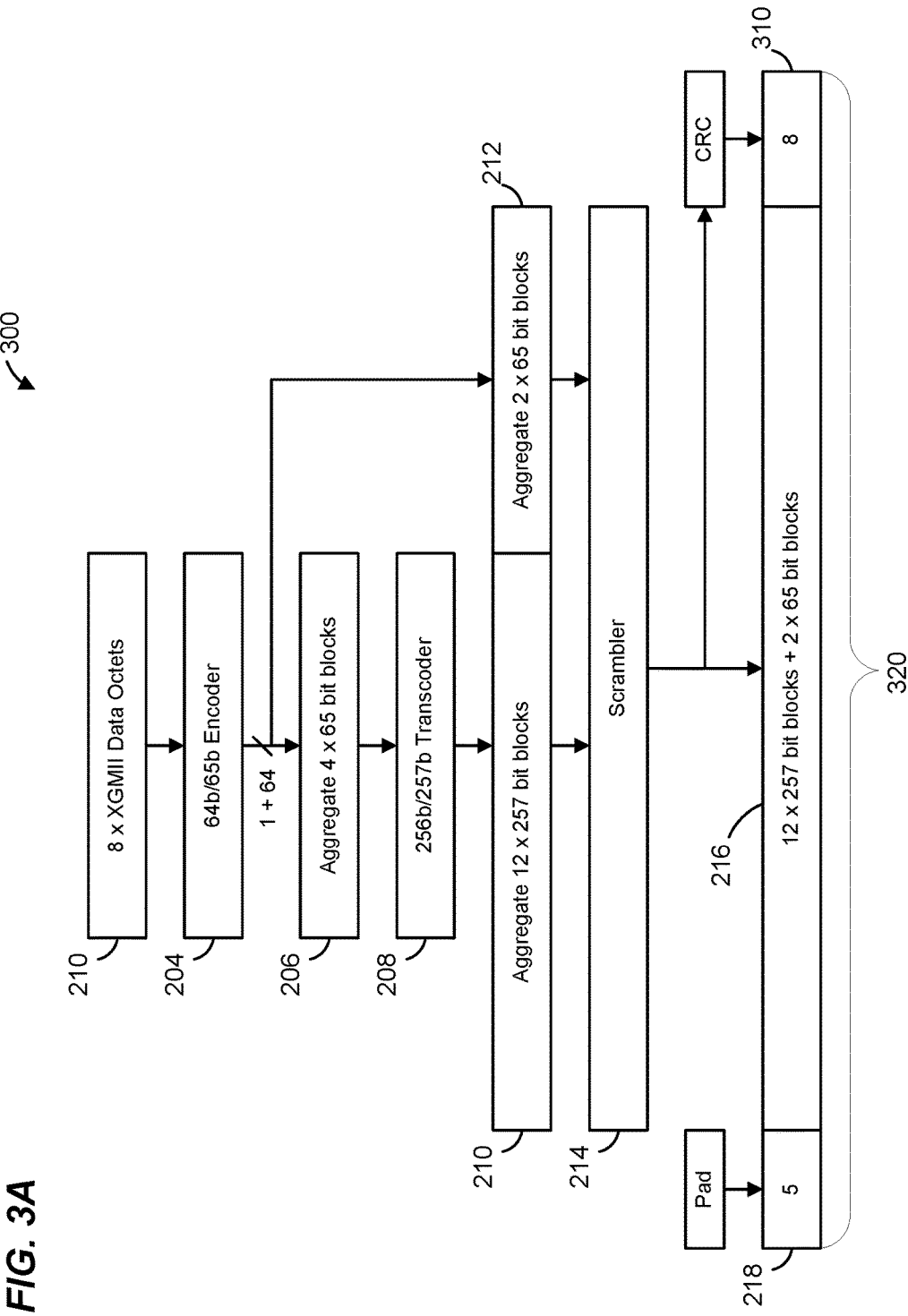
FIG. 3A is a diagram of an example compacting technique, according to another embodiment.

FIG. 3A is a diagram of an example compaction technique 300, according to another embodiment. In some embodiments, the compaction technique 300 is implemented by the PHY processing device 120 in the network interface device 100 of FIG. 1, and FIG. 3A is described with reference to FIG. 1 for explanatory purposes. In other embodiments, however, the compaction technique 300 is implemented by another suitable network interface device.

The compaction technique 300 is similar to the compaction technique 200 of FIG. 2A, and the descriptions of like-numbered elements are omitted for brevity. However, in addition to adding the five padding bits 218, the PHY processing device 120 is further configured to add 8 CRC bits 310 to the aggregated bit block 216. Together, the five padding bits 218, the aggregated bit block 216, and the 8 CRC bits 310 form the padded bit block 320. Although five padding bits 218 are added to the aggregated bit block 216 in the present embodiment, in other embodiments, padding bits fewer than or more than five (e.g., one, two, three, four, six, etc.) are used.

Figure 3B:
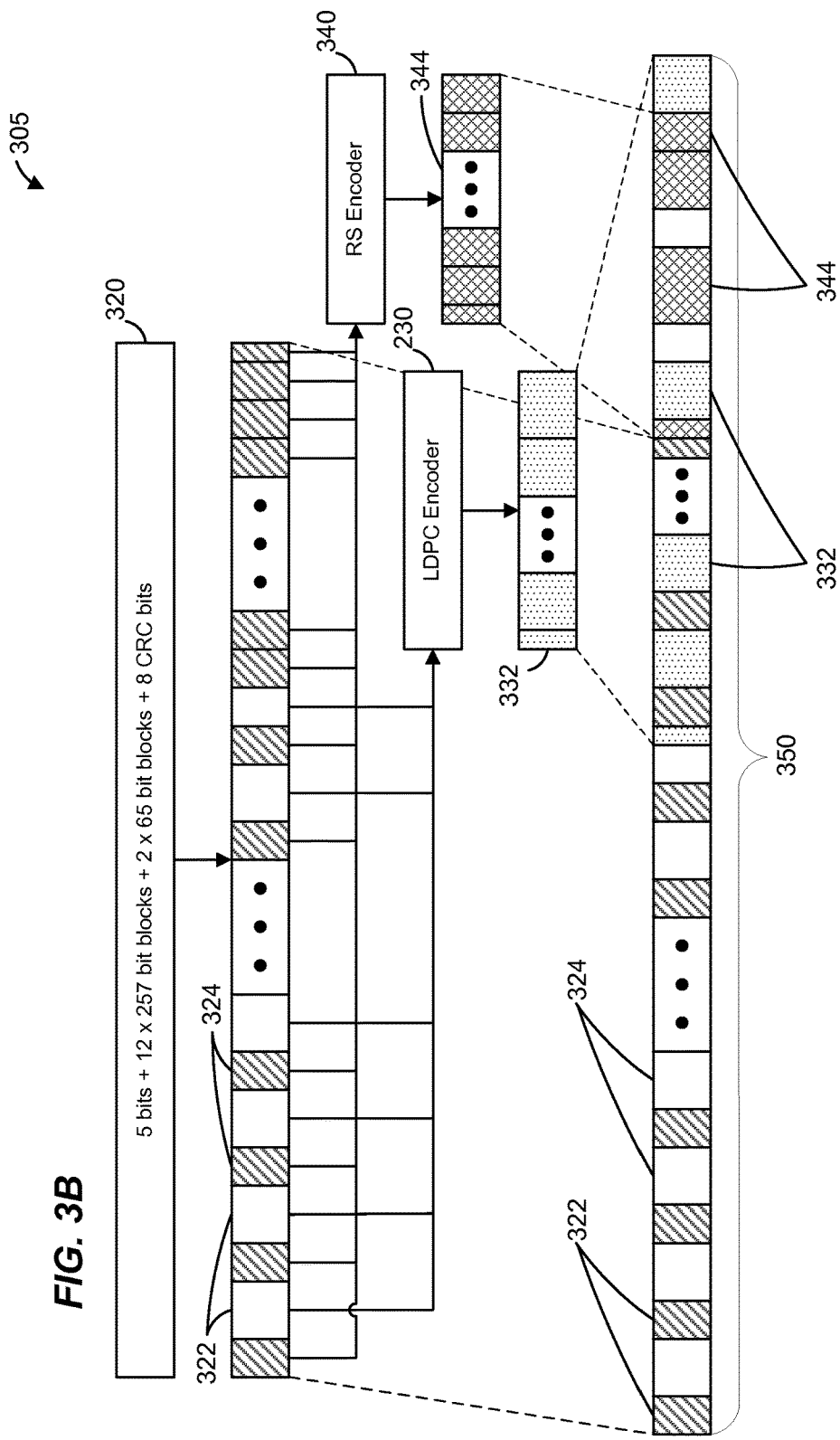
FIG. 3B is a diagram of an example encoding technique, according to another embodiment.

FIG. 3B is a diagram of an example encoding technique 305, according to another embodiment. In some embodiments, the encoding technique 305 is implemented by the PHY processing device 120 in the network interface device 100 of FIG. 1, and FIG. 3B is described with reference to FIG. 1 for explanatory purposes. In other embodiments, however, the encoding technique 305 is implemented by another suitable network interface device. The encoding technique 305 follows the compaction technique 300 of FIG. 3A. The PHY processing device 120 is configured to use the compaction technique 300 in combination with the encoding technique 305 to generate a frame, according to an embodiment.

The bits in the padded bit block 320 are divided into a set of bits 322 and a set of bits 324. The set of bits 322 includes 1723 bits, and the set of bits 324 includes 1504 bits. The PHY processing device 120 is configured to encode bits 322 using the LDPC encoder 230, which generates LDPC parity bits 332. In an embodiment, the LDPC encoder 230 is the same as the LDPC encoder used in 10GBASE-T, in which 325 LDPC parity bits are generated. Furthermore, the PHY processing device 120 is configured to encode bits 324 using a RS encoder 340, which generates RS parity bits 344.

The RS encoder 340 is different from the RS encoder 240 of FIG. 2B due to the addition of 8 CRC bits 310, according to an embodiment. The RS encoding scheme used by RS encoder 240 is represented by notation RS(192, 187), in which 187 8-bit symbols are encoded to make an 192 symbol RS codeword and to generate 40 RS parity bits. On the other hand, the RS encoding scheme used by RS encoder 340 is noted as RS(192, 188), in which 188 8-bit symbols are encoded to make an 192 RS codeword and to generate 32 RS parity bits, according to an embodiment. Both RS encoder 240 and RS encoder 340 can correct 2 8-bit symbols. In other embodiments, however, other RS suitable encoding schemes are implemented by the RS encoder 240 and RS encoder 340.

The PHY processing device 120 is further configured to arrange bits 322, bits 324, LDPC parity bits 332 and RS parity bits 344 into a frame 350. The RS parity bits 344 are placed in slots that would have otherwise been used by uncoded bits in conventional 10GBASE-T. However, the compaction technique 300 reduces the number of bits in the padded bit block 320, which make these slots that would otherwise be used for padding (in conventional 10GBASE-T) available for the RS parity bits without increasing the total number of bits in the frame 350.

The PHY processing device 120, according to an embodiment, is configured to modulate the bits in the frame 350. The PHY processing device 120 is configured to modulate the bits in the frame 350 (3584 total bits), by mapping them into 512 DSQ128 symbols. The PHY processing device 120 according to an embodiment is configured to modulate the bits in the frame 350 using the same DSQ128 modulation scheme that is used in conventional 10GBASE-T. In an embodiment, the PHY processing device 120 is configured to map encoded bits and parity bits such that i) LDPC encoded bits select a constellation point from among a cluster (e.g., a 4×4 cluster) of adjacent constellation points, and ii) RS encoded bits select one cluster from among a set of different clusters (e.g., eight clusters) of constellation points. Accordingly, the PHY processing device 120 is configured map encoded bits and parity bits such that the RS encoded bits are less prone to errors than the LDPC encoded bits when transmitted over a communication link.

Figure 4:
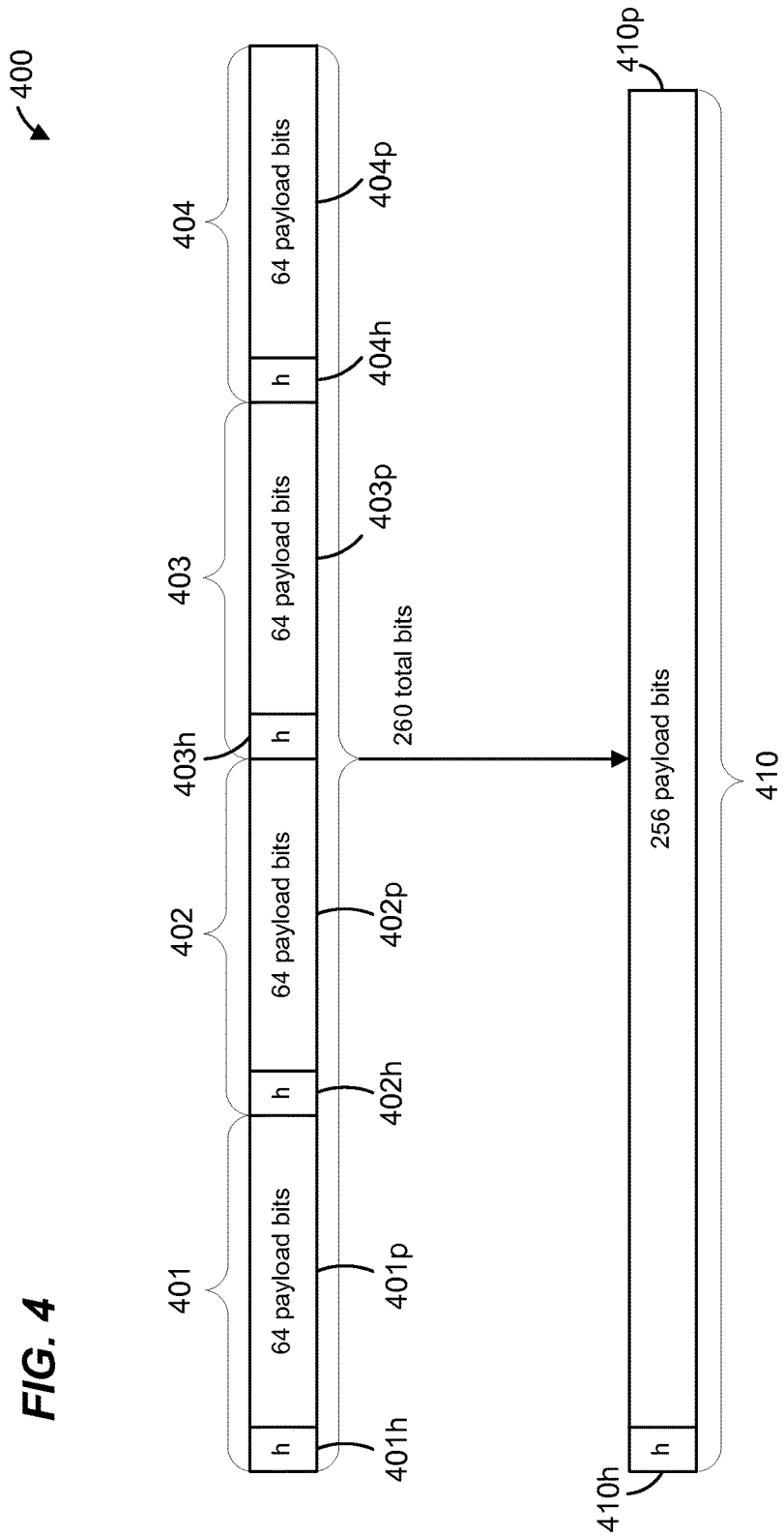
FIG. 4 is a diagram of an example transcoding scheme, according to an embodiment.

FIG. 4 is a diagram of an example transcoding scheme 400, according to an embodiment. In some embodiments, the transcoding scheme 400 is implemented by the PHY processing device 120 in the network interface device 100 of FIG. 1, and FIG. 4 is described with reference to FIG. 1 for explanatory purposes. In other embodiments, however, the transcoding scheme 400 is implemented by another suitable network interface device.

In some embodiments, the transcoding scheme 400 is implemented by the 256b/257b transcoder 208 of FIGS. 2A and 3A. In other embodiments, the 256b/257b transcoder 208 implements another suitable transcoding scheme, such as the 256b/257b transcoding scheme described in Clause 91.5.2.5 of the IEEE Standard for Ethernet Amendment 2: Physical Layer Specifications and Management Parameters for 100 Gb/s Operation Over Backplanes and Cooper Cables, IEEE Standard 802.3bj, *The Institute for Electrical and Electronics Engineers*, 2014, the entirety of which is herein incorporated by reference. In yet other embodiments, the 256b/257b transcoder 208 implements yet another suitable scheme, such as the 8N/(8N+1) pointer based coding scheme with N=32 as described in U.S. Pat. No. 7,251,699 entitled "Low Overhead Coding with Arbitrary Control Symbol Placement", the entirety of which is herein incorporated by reference.

The PHY processing device 120 is configured to implement the transcoding scheme 400 by first aggregating four 65-bit blocks 401, 402, 403, and 404. Each 65-bit block contains a header bit and 64 payload bits. For example, block 401 includes a header bit 401h and payload bits 401p, block 402 includes a header bit 402h and payload bits 402p, block 403 includes a header bit 403h and payload bits 403p, and block 404 includes a header bit 404h and payload bits 404p. The header bit in each of the blocks 401-404 is an indicator of whether the 65-bit block is a data block or a control block. For example, the header bits 401h, 402h, 403h, and 404h, respectively indicate whether the blocks 401, 402, 403, and 404 are data blocks or control blocks. In an embodiment in which the blocks 401-404 are formatted according to the IEEE 802.3 Standard, the header bit is 0 when the block is a data block, and the header bit is 1 when the block is a control block.

The PHY processing device 120 is then configured to transcode the aggregated four blocks 401 to 404 into a 257-bit block 410. The 257-bit block 410 includes one header bit 410h and 256 payload bits 410p. The one header bit 410h is an indicator of whether all 256 payload bits 410p are data bits or if at least some of the 256 payload bits 410 are control bits. In an embodiment, the one header bit 410p is 1 when all of the 256 payload bits 410p are data bits, and the one header bit 410 is 0 when some or all of the 256 payload bits 410p are control bits. The 256 payload bits 410p include at least the payload bits 401p, 402p, 403p, and 404p.

When aggregated, the four 65-bit blocks 401, 402, 403, and 404 contains 260 total bits. On the other hand, after transcoding, the 257-bit block 410 only contains 257 bits, freeing up 3 bits for other uses, such as for error correction encoding purposes.

Figure 5:
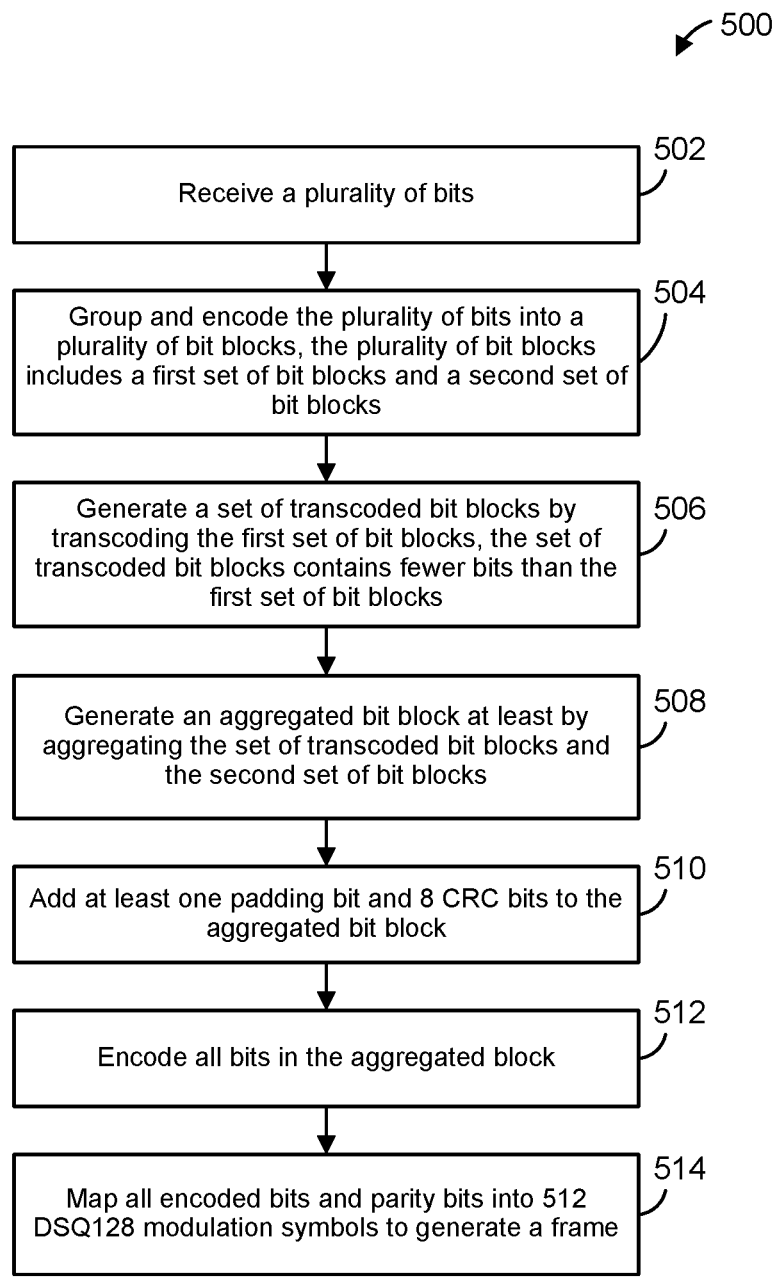
FIG. 5 is a flow diagram illustrating an example method, implemented in a network interface device, for generating a communication frame, according to an embodiment.

FIG. 5 is a flow diagram illustrating an example method 500, implemented in a network interface device, for generating a frame, according to an embodiment. In some embodiments, the method 500 is implemented by the PHY processing device 120 in the network interface device 100 of FIG. 1, and FIG. 5 is described with reference to FIG. 1 for explanatory purposes. In other embodiments, however, the method 500 is implemented by another suitable network interface device. In some embodiments, the method 500 is implemented in conjunction with the compaction technique 200 of FIG. 2A or the compaction technique 300 of FIG. 3A, and FIG. 5 is described with reference to FIGS. 2A and 3A for explanatory purposes. In other embodiments, however, the method 500 is implemented in conjunction with other suitable compaction techniques.

At 502, the PHY processing device 120, according to an embodiment, receives a plurality of bits. At 504, the PHY processing device 120 groups and encodes the plurality of bits into a plurality of bit blocks. For example, 504 includes grouping/encoding into 65-bit blocks, as illustrated in FIGS. 2A and 3A, according to some embodiments.

The plurality of bit blocks includes a first set of bit blocks (e.g., bit blocks corresponding to twelve sets of the four bit blocks in 206) and a second set of bit blocks (e.g., bit blocks corresponding to the two bit blocks in 212). At 506, the PHY processing device 120 is configured to generate a set of transcoded bit blocks by transcoding the first set of bit blocks. For example, 506 includes generating 257 bit blocks in 210, as illustrated in FIGS. 2A and 3A, according to some embodiments. The set of transcoded bit blocks contains fewer bits than the first set of bit blocks.

At 508, the PHY processing device 120 is configured to generate an aggregated bit block at least by aggregating the set of transcoded bit blocks and the second set of bit blocks. For example, 508 includes aggregating 12 257-bit blocks and 2 65-bit blocks, as illustrated in FIGS. 2A and 3A (#210 and #212), according to some embodiments.

At 510, the PHY processing device 120 is configured to add at least one padding bit to the aggregated bit block. For example, 510 includes adding padding bits 218, as illustrated in FIGS. 2A and 3A, according to some embodiments.

Then at 512, the PHY processing device 120 is configured to encode all bits in the aggregated bit block according to one or more error correction encoding schemes. In an embodiment, the PHY processing device 120 is configured to encode a portion of the bits in the aggregated bit block using a first encoder to generate a set of first parity bits, and encode a remaining portion of the bits in the aggregated bit block using a second encoder to generate a set of second parity bits. For example, in an embodiment, the first encoder is a LDPC encoder and the first parity bits are LDPC parity bits, and the second encoder is a RS encoder and the second parity bits are RS parity bits. For example, 512 includes encoding such as illustrated in FIG. 2B or FIG. 3B, according to some embodiments.

At 514, the PHY processing device 120 is configured to modulate the encoded bits in the aggregated bit block and parity bits (e.g., LDPC parity bits and RS parity bits) to generate a frame. In an embodiment, the PHY processing device 120 is configured to map all the encoded bits and the parity bits into 512 DSQ128 modulation symbols, consistent with the modulation scheme used in conventional 10GBASE-T. In other embodiments, other suitable modulation schemes are utilized. In an embodiment, the PHY processing device 120 is configured to map encoded bits and parity bits such that i) LDPC encoded bits select a constellation point from among a cluster (e.g., a 4×4 cluster) of adjacent constellation points, and ii) RS encoded bits select one cluster from among a set of different clusters (e.g., eight clusters) of constellation points. Accordingly, the PHY processing device 120 is configured map encoded bits and parity bits such that the RS encoded bits are less prone to errors than the LDPC encoded bits when transmitted over a communication link.

Figure 6:
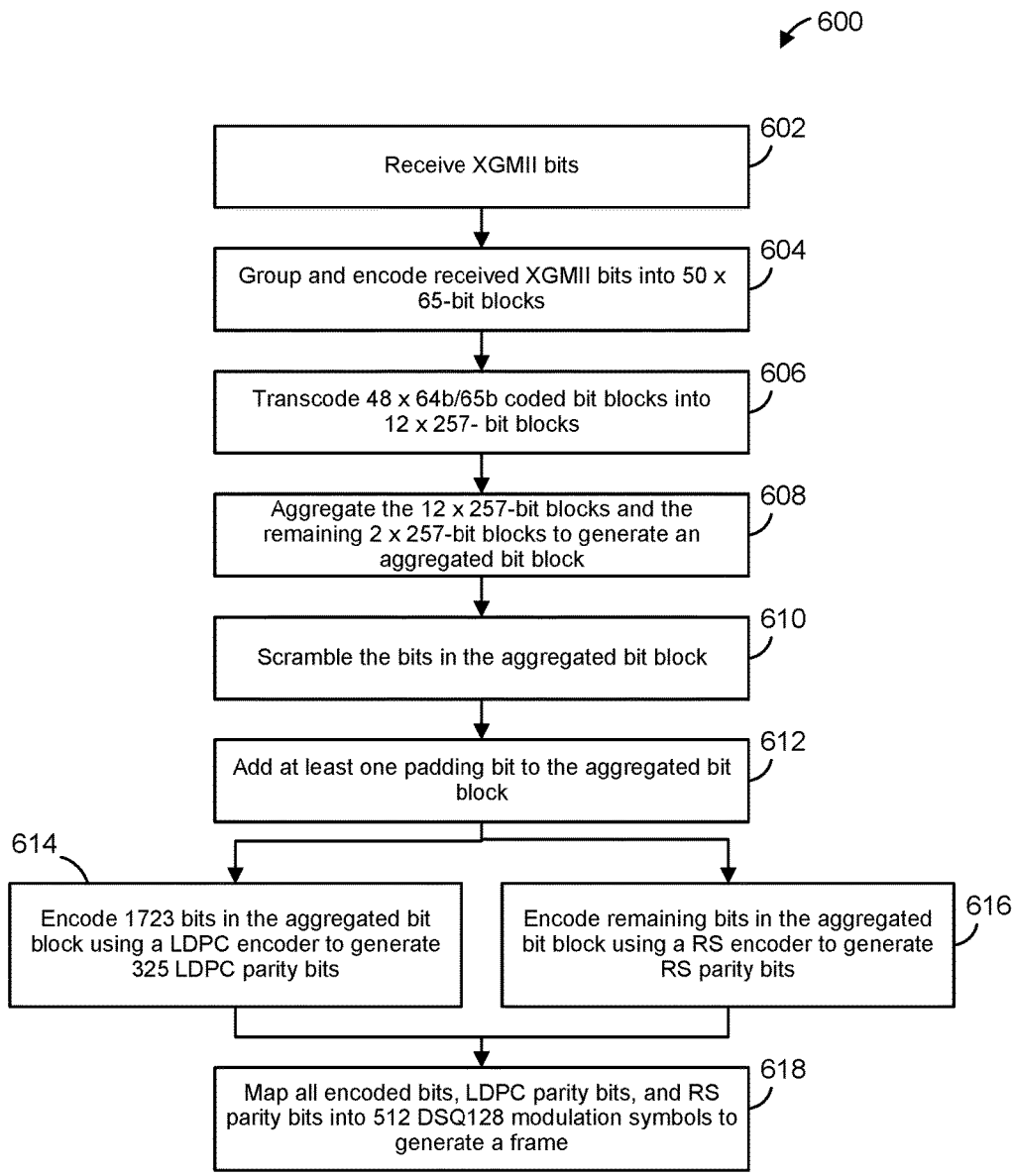
FIG. 6 is a flow diagram illustrating another example method, implemented in a network interface device, for generating a communication frame, according to another embodiment.

FIG. 6 is a flow diagram illustrating another example method 600, implemented in a network interface device, for generating a frame, according to another embodiment. In some embodiments, the method 600 is implemented by the PHY processing device 120 in the network interface device 100 of FIG. 1, and FIG. 6 is described with reference to FIG. 1 for explanatory purposes. In other embodiments, however, the method 600 is implemented by another suitable network interface device.

In an embodiment, at 602, the PHY processing device 120 is configured to receive bits provided by the MAC processing device 110 via the XGMII interface 130. At 604, the PHY processing device 120 is configured to group and encode the received bits into fifty 65-bit blocks, where each 65-bit block includes one header bit and 64 payload bits. At 606, the PHY processing device 120 is configured to transcode forty-eight of the fifty 65-bit blocks into twelve 257-bit blocks. Each 257-bit block is generated by aggregating four 65-bit blocks, and transcoding the aggregated four 65-bit blocks into a 257-bit block, where the 257-bit block includes one header bit and 256 payload bits, according to an embodiment. At 608, the PHY processing device 120 is further configured to aggregate the twelve 257-bit blocks and two remaining 65-bit blocks to generate an aggregated bit block. At 610, the PHY processing device 120 is configured to scramble the bits in the aggregated bit block. In some embodiments, 610 is omitted.

At 612, the PHY processing device 120 is configured to add at least one padding bit to the aggregated bit block.

Then, the PHY processing device 120 is configured to encode all bits in the aggregated bit block according to multiple error correction encoding schemes. In an embodiment, the bits in the aggregated bit block are encoded using two encoding schemes. At 614, the PHY processing device is configured to encode 1723 bits in the aggregated bit block using a LDPC encoder to generate LDPC parity bits. In an embodiment, the LDPC encoder is the same as the LDPC encoder used in 10GBASE-T. At 616, the PHY processing device is configured to encode the remaining bits in the aggregated bit block using an RS encoder to generate RS parity bits.

After encoding, at 618, the PHY processing device 120 is configured to modulate the encoded bits in the aggregated bit block, the LDPC parity bits, and the RS parity bits to generate a frame. In an embodiment, the PHY processing device 120 is configured to modulate encoded bits and parity bits into 512 DSQ128 modulation symbols, which is the same modulation technique used in conventional 10GBASE-T. In an embodiment, the PHY processing device 120 is configured to map encoded bits and parity bits such that i) LDPC encoded bits select a constellation point from among a cluster (e.g., a 4×4 cluster) of adjacent constellation points, and ii) RS encoded bits select one cluster from among a set of different clusters (e.g., eight clusters) of constellation points. Accordingly, the PHY processing device 120 is configured map encoded bits and parity bits such that the RS encoded bits are less prone to errors than the LDPC encoded bits when transmitted over a communication link.

Figure 7:
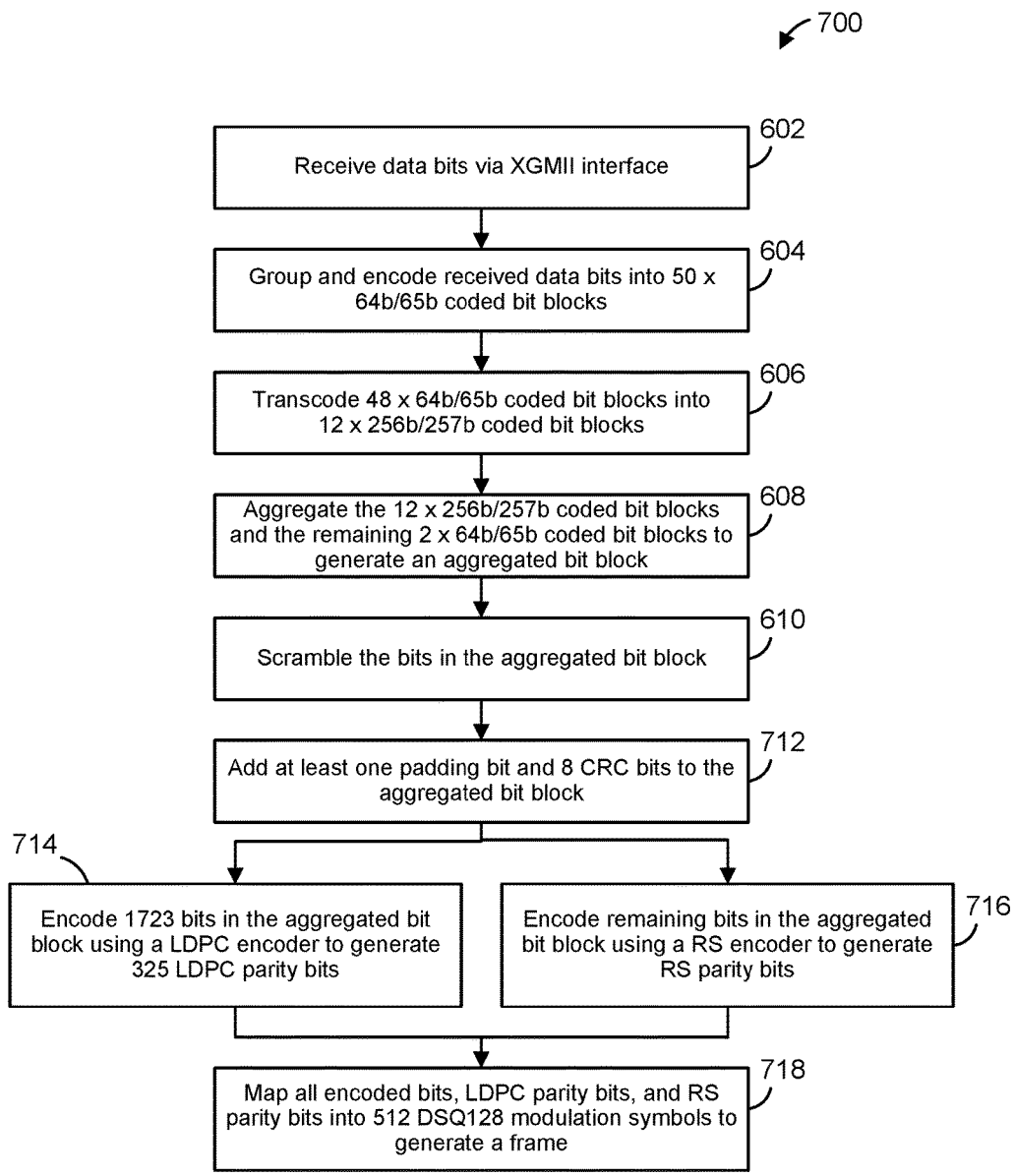
FIG. 7 is a flow diagram illustrating another example method, implemented in a network interface device, for generating a communication frame, according to yet another embodiment.

FIG. 7 is a flow diagram illustrating another example method 700, implemented in a network interface device, for generating a frame, according to yet another embodiment. In some embodiments, the method 700 is implemented by the PHY processing device 120 in the network interface device 100 of FIG. 1, and FIG. 7 is described with reference to FIG. 1 for explanatory purposes. In other embodiments, however, the method 700 is implemented by another suitable network interface device.

The method 700 is similar to the method 600 of FIG. 6, and the descriptions of like-numbered elements are omitted for brevity. At 712, however, in addition to adding at least one padding bit to the aggregated bit block, the PHY processing device 120 is further configured to add 8 CRC bits to the aggregated bit block. Then, the PHY processing device 120 is configured to encode all bits in the aggregated bit block using multiple encoding schemes. At 714, the PHY processing device is configured to encode 1723 bits in the aggregated bit block using a LDPC encoder to generate LDPC parity bits. In an embodiment, the LDPC encoder is the same as the LDPC encoder used in 10GBASE-T. At 716, the PHY processing device is configured to encode the remaining bits in the aggregated bit block using a RS encoder to generate RS parity bits.

After encoding, at 718, the PHY processing device 120 is configured to modulate the encoded bits in the aggregated bit block, the LDPC parity bits, and the RS parity bits to generate a frame. In an embodiment, the PHY processing device 120 is configured to modulate encoded bits and parity bits into 512 DSQ128 modulation symbols, which is the same modulation technique used in 10GBASE-T. In an embodiment, the PHY processing device 120 is configured to map encoded bits and parity bits such that i) LDPC encoded bits select a constellation point from among a cluster (e.g., a 4×4 cluster) of adjacent constellation points, and ii) RS encoded bits select one cluster from among a set of different clusters (e.g., eight clusters) of constellation points. Accordingly, the PHY processing device 120 is configured map encoded bits and parity bits such that the RS encoded bits are less prone to errors than the LDPC encoded bits when transmitted over a communication link.

FIG. 8A is a diagram of an example decoding technique 800, according to an embodiment. In some embodiments, the decoding technique 800 is implemented by the PHY processing device 120 in the network interface device 100 of FIG. 1, and FIG. 8A is described with reference to FIG. 1 for explanatory purposes. In other embodiments, however, the decoding technique 800 is implemented by another suitable network interface device.

According to the decoding technique 800, the PHY processing device 120 is configured to receive a communication frame 810. In an embodiment, the communication frame 810 has 3584 total bits, which include LDPC-encoded bits 812, RS-encoded bits 814, LDPC parity bits 822, and RS parity bits 834. The PHY processing device 120 is configured to perform forward error correction on the communication frame 810 using a LDPC decoder 820 and a RS decoder 830. The PHY processing device 120 is configured to decode the LDPC-encoded bits 810 using the LDPC decoder 820 and perform error correction using the LDPC parity bits 822. In an embodiment, the LDPC decoder 820 is the same as a LDPC decoder used in 10GBASE-T. The PHY processing device 120 is further configured to decode the RS-encoded bits 814 using the RS encoder 830 and perform error correction using the RS parity bits 834. The LDPC decoder 820 and the RS decoder 830 output the decoded bits as a decoded bit block 840. The decoded bit block 840 does not include the LDPC parity bits 822 or the RS parity bits 834, since the LDC parity bits 822 are used only to decode the LDPC-encoded bits 812 and the RS parity bits 834 are used only to decode the RS-encoded bits 814.

In an embodiment, the decoded bit block 840 includes an aggregated decoded bit block 842, five padding bits 844, and 8 CRC bits 846. The aggregated decoded bit block 842 includes twelve 257-bit blocks and two 65-bit blocks. The 8 CRC bits 846 offer another layer of protection and indicate whether an error exists in the decoded bit block 840. However, the 8 CRC bits 846 cannot be used to correct the error. In another embodiment, however, the 8 CRC bits 846 is omitted. Although five padding bits 844 are included in the decoded bit block 840 in the present embodiment, in other embodiments, a number of padding bits fewer than or more than five (e.g., one, two, three, four, six, etc.) can be included.

Figure 8B:
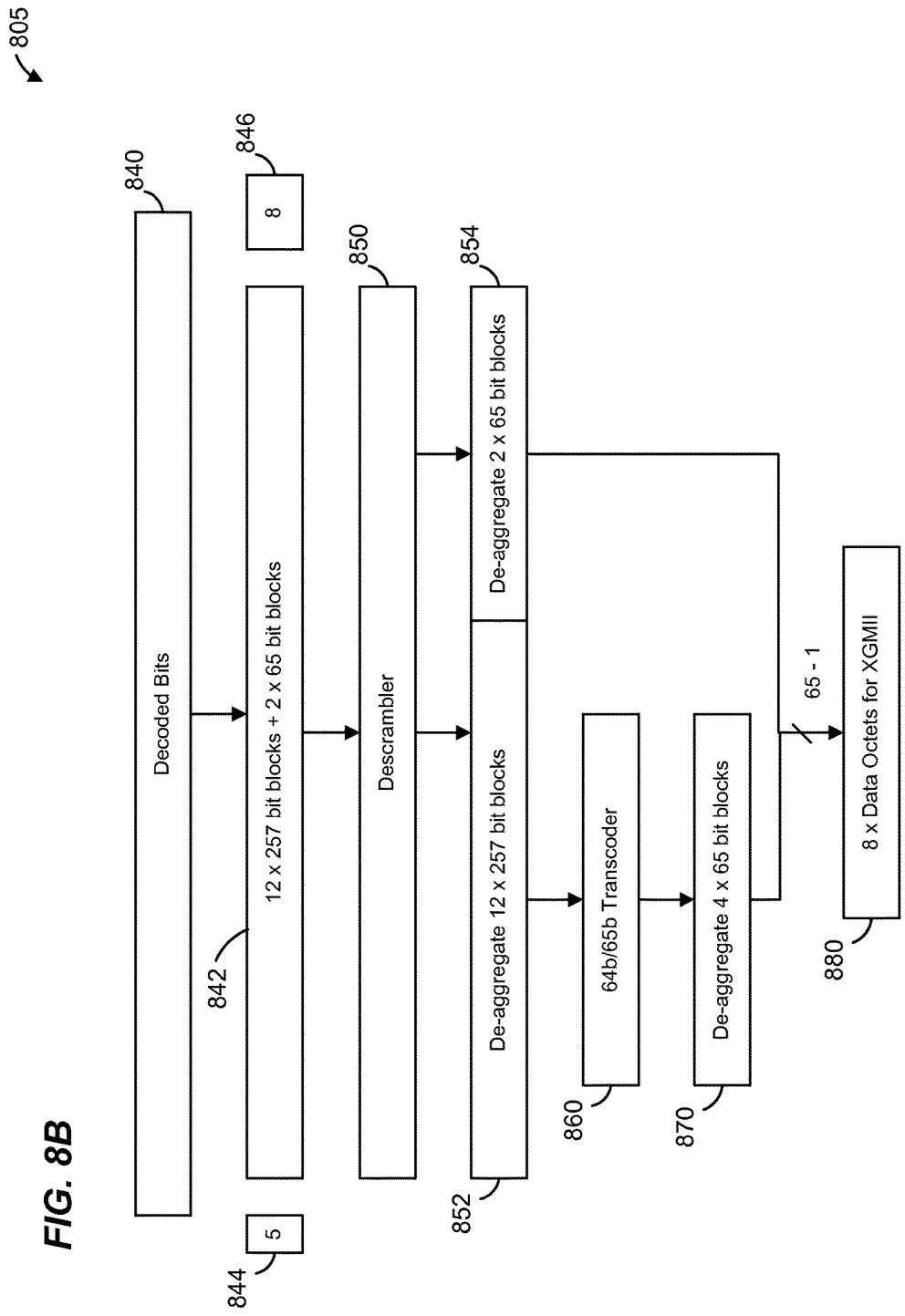
FIG. 8B is a diagram of an example de-compaction technique, according to an embodiment.

FIG. 8B is a diagram of an example de-compaction technique 805, according to an embodiment. In some embodiments, the de-compaction technique 805 is implemented by the PHY processing device 120 in the network interface device 100 of FIG. 1, and FIG. 8B is described with reference to FIG. 1 for explanatory purposes. In other embodiments, however, the de-compaction technique 805 is implemented by another suitable network interface device. The de-compaction technique 805 follows the decoding technique 800 of FIG. 8A. The PHY processing device 120 is configured to use the de-compaction technique 805 in combination with the decoding technique 800 to generate data from a communication frame.

According to the de-compaction technique 805, the PHY processing device 120 is configured to remove the five padding bits 844 and the 8 CRC bits 846 from the decoded bit block 840. In another embodiment, if the 8 CRC bits 846 is omitted from the decoded bit block 840, then the PHY processing device 120 is configured to remove only the five padding bits 844. After the five padding bits 844 and the 8 CRC bits 846 are removed, the PHY processing device 120 is configured to descramble the bits in the aggregated decoded bit block 842 using a descrambler 850.

After descrambling the bits in the aggregated decoded bit block 842, the PHY processing device 120 is configured to de-aggregate the twelve 257-bit blocks 852 and de-aggregate the two 65-bit blocks 854. The PHY processing device 120 is further configured to transcode each 257-bit block into four 65-bit blocks using a 64b/65b transcoder 860. The PHY processing device 120 is configured to de-aggregate the four 65-bit blocks 870. The PHY processing device 120 is configured to transcode and de-aggregate the twelve 257-bit blocks 852 into forty-eight (48) 65-bit blocks are generated. The forty-eight de-aggregated 65-bit blocks and the two de-aggregated 65-bit blocks 854 form a total of fifty (50) 65-bit blocks. The PHY processing device 120 is configured to remove a header bit from each of the de-aggregated 65-bit blocks, leaving a 64-bit block. The 64-bit block is then divided into eight (8) data octets 880 for transmission to the MAC processing device 110 via the XGMII 130.

Figure 9:
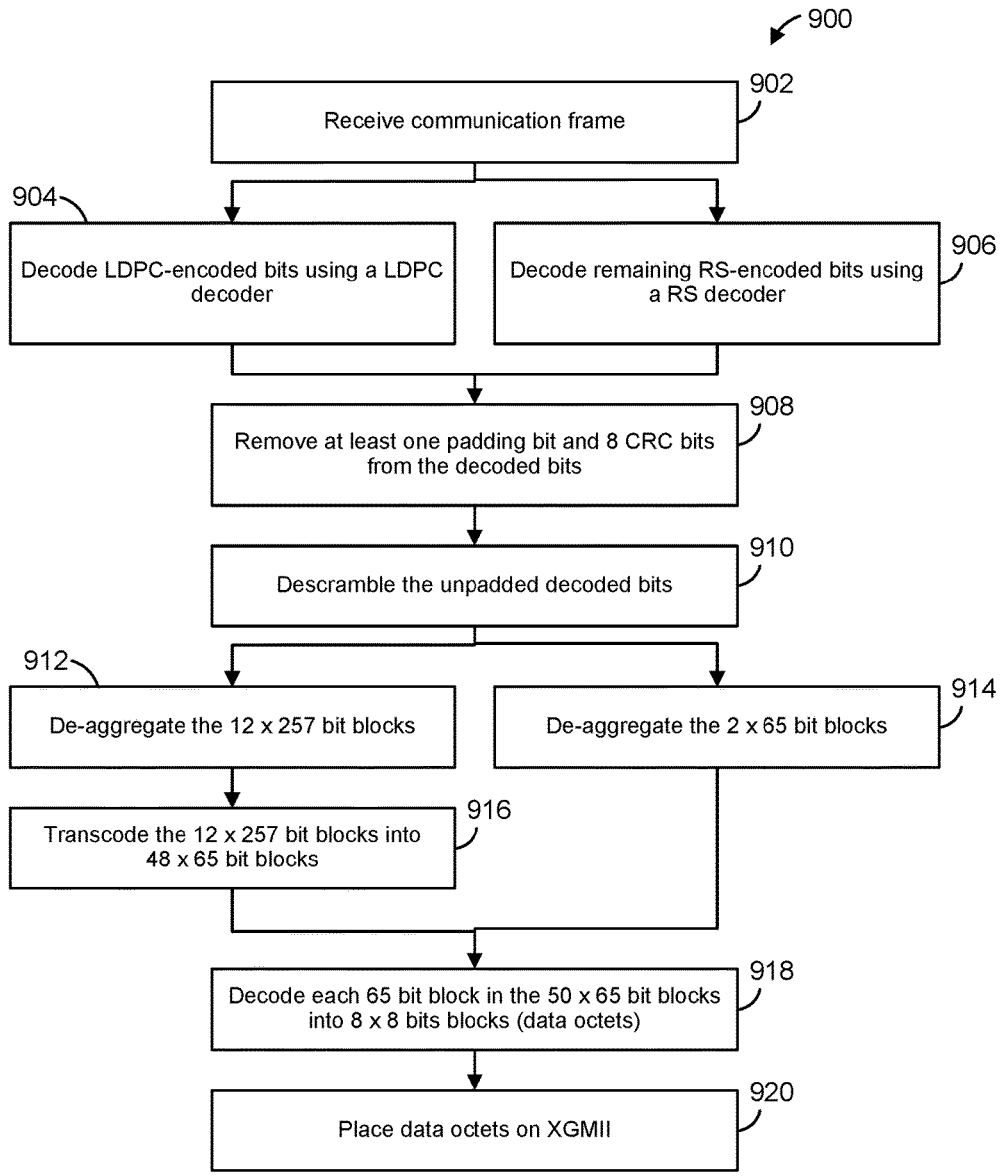
FIG. 9 is a flow diagram illustrating an example method, implemented in a network interface device, for generating data from a communication frame, according to an embodiment.

FIG. 9 is a flow diagram illustrating an example method, implemented in a network interface device, for generating data from a communication frame, according to an embodiment. In some embodiments, the method 900 is implemented by the PHY processing device 120 in the network interface device 100 of FIG. 1, and FIG. 9 is described with reference to FIG. 1 for explanatory purposes. In other embodiments, however, the method 900 is implemented by another suitable network interface device.

In an embodiment, the PHY processing device 120 is configured to receive a communication frame at 902. The communication frame includes LDPC-encoded bits, RS-encoded bits, LDPC parity bits, and RS parity bits. At 904, the PHY processing device 120 is configured to decode and perform forward error correction on the LDPC-encoded bits in the communication frame using the LDPC parity bits. At 906, the PHY processing device 120 is configured to decode and perform forward error correction on the RS-encoded bits using the RS parity bits.

After the encoded bits in the communication frame are decoded, the PHY processing device 120 is configured to remove at least one padding bit and 8 CRC bits from the decoded bits at 908. In another embodiment, if the 8 CRC bits are omitted from the decoded bits, then the PHY processing device is configured to remove only the at least one padding bit from the decoded bits. The PHY processing device 120 is further configured to descramble the unpadded decoded bits at 910.

The unpadded decoded bits include twelve 257-bit blocks and two 65-bit blocks. At 912, the PHY processing device 120 is configured to de-aggregate the twelve 257-bit blocks. At 914, the PHY processing device 120 is configured to de-aggregate the two 65-bit blocks. For each 257-bit block, the PHY processing device 120 is configured to transcode the 257-bit block into four 65-bit blocks. In total, the PHY processing device 120 is configured to transcode the twelve 257-bit blocks into forty-eight 65-bit blocks at 916.

At 918, the PHY processing device 120 is configured to decode each of the 65-bit blocks in the forty-eight 65-bit blocks into eight (8) 8-bit blocks or data octets. Then at 920, the PHY processing device 120 is configured to place the data octets on the XGMII 130 for transmission to the MAC processing device 110.

At least some of the various blocks, operations, and techniques described above may be implemented utilizing hardware, a processor executing firmware instructions, a processor executing software instructions, or any suitable combination thereof. When implemented utilizing a processor executing software or firmware instructions, the software or firmware instructions may be stored in any tangible, non-transitory computer readable medium, or media, such as a magnetic disk, an optical disk, a random access memory (RAM), a read only memory (ROM), a flash memory, a memory of a processor, a tape drive, etc. The software or firmware instructions may include machine readable instructions that, when executed by one or more processors, cause the one or more processors to perform various acts.

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method for generating a fixed length frame in a network interface device, the method comprising:
    receiving, at the network interface device, a plurality of bits for transmission in the fixed length frame;
    grouping and encoding, at the network interface device, the plurality of bits into a plurality of bit blocks, wherein the plurality of bit blocks comprises a first set of bit blocks and a second set of bit blocks;
    generating, at the network interface device, a set of transcoded bit blocks by transcoding the first set of bit blocks, wherein the set of transcoded bit blocks contains fewer bits than the first set of bit blocks, to make a number of bits available for use as parity bits in the fixed length frame;
    generating, at the network interface device, an aggregated bit block at least by aggregating the set of transcoded bit blocks and the second set of bit blocks;
    encoding, at the network interface device, a portion of the bits in the aggregated bit block using a first encoder to generate a first set of encoded bits, including a set of first parity bits for protecting bits in the first set of encoded bits, the set of first parity bits generated according to a first error correction encoding scheme;

encoding, at the network interface device, a remaining portion of the bits in the aggregated bit block using a second encoder to generate a second set of encoded bits, including a set of second parity bits for protecting bits in the second set of encoded bits, the second set of parity bits generated according to a second error correction encoding scheme, wherein a number of bits in the second set of encoded bits is greater than a number of bits in the remaining portion of the bits, and wherein i) the set of second parity bits includes a smaller number of parity bits as compared to a greater number of parity bits included in the set of first parity bits and ii) the smaller number of parity bits in the second set of parity bits does not exceed the number of bits made available for use as parity bits in the fixed length frame such that the parity bits in the second set of parity bits fit into the fixed length frame;

selecting, at the network interface, constellation points for modulating the first set of encoded bits and the second set of encoded bits, including selecting, based on bits in the second set of encoded bits, clusters from among a plurality of clusters of adjacent constellation points, and selecting, based on bits in the first set of encoded bits, constellation points within the clusters of adjacent constellation points such that, when transmitted via the communication link, bits in the second set of encoded bits that includes the smaller number of parity bits are less prone to errors than bits in the first set of encoded bits that includes the greater number of parity bits; and modulating, at the network interface device according to the selected constellation points, the first set of encoded bits and the second set of encoded bits in the aggregated bit block to generate the fixed-length frame that fits the first set of encoded bits including the greater number of parity bits and the second set of encoded bits including the smaller number of parity bits.

2. The method of claim 1, wherein
the first encoder is a low-density parity-check code (LDPC) encoder and the first parity bits are LDPC parity bits; and
the second encoder is a Reed-Solomon (RS) encoder and the second parity bits are RS parity bits.

3. The method of claim 1, wherein the first set of bit blocks comprises a plurality of subsets of bit blocks, and transcoding the first set of bit blocks comprises transcoding each subset of bit blocks into a transcoded bit block.

4. The method of claim 3, wherein
a subset of bit blocks comprises a plurality of payload bits and a plurality of header bits, and
a transcoded bit block of the subset of bit blocks comprises the plurality of payload bits and one header bit.

5. The method of claim 4, wherein the one header bit of the transcoded bit block is an indicator of whether the plurality of payload bits in the transcoded bit block are data bits or control bits.

6. The method of claim 1, further comprising scrambling, at the network interface, the bits in the aggregated bit block before the bits in the aggregated bit block are encoded.

7. The method of claim 1, further comprising adding, at the network interface, at least one padding bit to the aggregated bit block before the bits in the aggregated bit block are encoded.

8. The method of claim 7, further comprising adding, at the network interface, cyclic redundancy check bits to the aggregated bit block before the bits in the aggregated bit block are encoded.

9. The method of claim 1, wherein modulating the encoded bits in the aggregated bit block comprises mapping, at the network interface, the encoded bits into a plurality of modulation symbols selected from a double squared 128 (DSQ128) constellation.

10. A network interface device, comprising:
a physical layer (PHY) processing device configured to
receive a plurality of bits for transmission in a fixed length frame;
group and encode the plurality of bits into a plurality of bit blocks, wherein the plurality of bit blocks comprises a first set of bit blocks and a second set of bit blocks;
generate a set of transcoded bit blocks by transcoding the first set of bit blocks, wherein the set of transcoded bit blocks contains fewer bits than the first set of bit blocks, to make a number of bits available for use as parity bits in the fixed length frame;
generate an aggregated bit block at least by aggregating the set of transcoded bit blocks and the second set of bit blocks;
encode a portion of the bits in the aggregated bit block using a first encoder to generate a first set of encoded bits, including a set of first parity bits for protecting bits in the first set of encoded bits, the set of first parity bits generated according to a first error correction encoding scheme;
encode a remaining portion of the bits in the aggregated bit block using a second encoder to generate a second set of encoded bits, including a set of second parity bits for protecting bits in the second set of encoded bits, the second set of parity bits generated according to a second error correction encoding scheme, wherein a number of bits in the second set of encoded bits is greater than a number of bits in the remaining portion of the bits, and wherein i) the set of second parity bits includes a smaller number of parity bits as compared to a greater number of parity bits included in the set of first parity bits and ii) the smaller number of parity bits in the second set of parity bits does not exceed the number of bits made available for use as parity bits in the fixed length frame such that the parity bits in the second set of parity bits fit into the fixed length frame;
select constellation points for modulating the first set of encoded bits and the second set of encoded bits, including
selecting, based on bits in the second set of encoded bits, clusters from among a plurality of clusters of adjacent constellation points, and
selecting, based on bits in the first set of encoded bits, constellation points within the clusters of adjacent constellation points such that, when transmitted via the communication link, bits in the second set of encoded bits that includes the smaller number of parity bits are less prone to errors than bits in the first set of encoded bits that includes the greater number of parity bits; and
modulate, according to the selected constellation points, the first set of encoded bits and the second set of encoded bits in the aggregated bit block to generate the frame that fits the first set of encoded bits including the greater number of parity bits and the second set of encoded bits including the smaller number of parity bits.

11. The network interface device of claim 10, wherein
the first encoder is a low-density parity-check code (LDPC) encoder and the first parity bits are LDPC parity bits; and
the second encoder is a Reed-Solomon (RS) encoder and the second parity bits are RS parity bits.

12. The network interface device of claim 10, wherein the first set of bit blocks comprises a plurality of subsets of bit blocks, and the PHY processing device is further configured to transcode each subset of bit blocks into a transcoded bit block.

13. The network interface device of claim 12, wherein
a subset of bit blocks comprises a plurality of payload bits and a plurality of header bits, and
a transcoded bit block of the subset of bit blocks comprises the plurality of payload bits and one header bit.

14. The network interface device of claim 13, wherein the one header bit of the transcoded bit block is an indicator of whether the plurality of payload bits in the transcoded bit block are data bits or control bits.

15. The network interface device of claim 10, wherein the PHY processing device is further configured to scramble bits in the aggregated bit block before the bits in the aggregated bit block are encoded.

16. The network interface device of claim 10, wherein the PHY processing device is further configured to add at least one padding bit to the aggregated bit block before the bits in the aggregated bit block are encoded.

17. The network interface device of claim 16, wherein the PHY processing device is further configured to add cyclic redundancy check bits to the aggregated bit block before the bits in the aggregated bit block are encoded.

18. The network interface device of claim 10, wherein the PHY processing device is configured to modulate the encoded bits in the aggregated bit block by mapping the encoded bits into a plurality of modulation symbols selected from a double squared 128 (DSQ128) constellation.

19. The network interface device of claim 10, further comprising a media access control layer (MAC) processing device configured to provide the plurality of bits to the PHY processing device.

20. A method for generating a fixed length frame in a network interface device, the method comprising:
receiving, at the network interface device, a plurality of bits for transmission in the fixed length frame;
grouping and encoding, at the network interface device, the plurality of bits into fifty 65-bit blocks, wherein each 65-bit block comprises one header bit and 64 payload bits;
transcoding, at the network interface device, forty-eight of the fifty 65-bit blocks into twelve 257-bit blocks to make a number of bits available for use as parity bits in the fixed length frame, wherein each 257-bit block is generated by
aggregating four 65-bit blocks, and
transcoding the aggregated four 65-bit blocks into a 257-bit coded bit block, wherein the 257-bit block comprises one header bit and 256 payload bits;
aggregating, at the network interface device, the twelve 257-bit blocks and two remaining 65-bit blocks to generate an aggregated bit block;
encoding, at the network interface device, a portion of the bits in the aggregated bit block using a low-density parity-check code (LDPC) encoder to generate a set of LDPC encoded bits including a set of LDPC parity bits for protecting bits in the set of LDPC encoded bits;
encoding, at the network interface device, a remaining portion of the bits in the aggregated bit block using a Reed-Solomon (RS) encoder to generate a set of RS encoded bits including a set of RS parity bits for protecting bits in the set of RS encoded bits, wherein i) the set RS parity bits includes a smaller number of parity bits as compared to a greater number of parity bits included in the set LDPC parity bits and ii) the smaller number of RS parity bits does not exceed the number of bits made available for use as parity bits in the fixed length frame such that the parity bits in the set of RS parity bits fit into the fixed length frame;
selecting, at the network interface, constellation points for modulating the set of LDPC encoded bits and the set of RS encoded bits, including
selecting, based on bits in the set of LDPC encoded bits, clusters from among a plurality of clusters of adjacent constellation points, and
selecting, based on bits in the set of RS encoded bits, constellation points within the clusters of adjacent constellation points such that, when transmitted via the communication link, bits in the set of RS encoded bits that includes the smaller number of parity bits are less prone to errors than bits in the set of LDPC encoded bits that includes the greater number of parity bits; and
modulating, at the network interface device according to the selected constellation points, the encoded bits in the aggregated bit block to generate the fixed length frame that fits the set of LDPC encoded bits including the greater number of parity bits and the set of RS encoded bits including the smaller number of parity bits.

21. The method of claim 20, wherein modulating the encoded bits in the aggregated bit block comprises mapping the encoded bits in the aggregated bit block, the LDPC parity bits, and the RS parity bits into a plurality of modulation symbols selected from a double squared 128 (DSQ128) constellation.

22. The method of claim 20, further comprising scrambling, at the network interface device, the bits in the aggregated bit block before the bits in the aggregated bit block are encoded.

23. The method of claim 20, further comprising adding, at the network interface device, at least one padding bit to the aggregated bit block before the bits in the aggregated bit block are encoded.

24. The method of claim 23, further comprising adding, at the network interface device, cyclic redundancy check bits to the aggregated bit block before the bits in the aggregated bit block are encoded.

25. A network interface device, comprising:
a physical layer (PHY) processing device configured to
receive a plurality of bits for transmission in a fixed length frame;
group and encode the plurality of bits into fifty 65-bit blocks, wherein each 65-bit block comprises one header bit and 64 payload bits;
transcode forty-eight of the fifty 65-bit blocks into twelve 257-bit blocks to make a number of bits available for use as parity bits in the fixed length frame, wherein each 257-bit block is generated by
aggregating four 65-bit blocks, and
transcoding the aggregated four 65-bit blocks into a 257-bit block, wherein the 257-bit block comprises one header bit and 256 payload bits;

aggregate the twelve 257-bit block and two remaining 65-bit blocks to generate an aggregated bit block;

encode a portion of the bits in the aggregated bit block using a low-density parity-check code (LDPC) encoder to generate a set of LDPC encoded bits including a set of LDPC parity bits for protecting bits in the set of LDPC encoded bits;

encode a remaining portion of the bits in the aggregated bit block using a Reed-Solomon (RS) encoder to generate a set of RS encoded bits including a set of RS parity bits for protecting bits in the set of RS encoded bits, wherein i) the set RS parity bits includes a smaller number of parity bits as compared to a greater number of parity bits included in the set LDPC parity bits and ii) the smaller number of RS parity bits does not exceed the number of bits made available for use as parity bits in the fixed length frame such that the parity bits in the set of RS parity bits fit into the fixed length frame;

select constellation points for modulating the set of LDPC encoded bits and the set of RS encoded bits, including selecting, based on bits in the set of LDPC encoded bits, clusters from among a plurality of clusters of adjacent constellation points, and selecting, based on bits in the set of RS encoded bits, constellation points within the clusters of adjacent constellation points such that, when transmitted via the communication link, bits in the set of RS encoded bits that includes the smaller number of parity bits are less prone to errors than bits in the set of LDPC encoded bits that includes the greater number of parity bits; and modulate, according to the selected constellation points, the encoded bits in the aggregated bit block to generate the fixed length frame that fits the set of LDPC encoded bits including the greater number of parity bits and the set of RS encoded bits including the smaller number of parity bits.

26. The network interface device of claim 25, wherein the PHY processing device is configured to modulate the encoded bits by mapping the encoded bits in the aggregated bit block, the LDPC parity bits, and the RS parity bits into a plurality of modulation symbols selected from a double squared 128 (DSQ128) constellation.

27. The network interface device of claim 25, wherein the PHY processing device is further configured to scramble the bits in the aggregated bit block before the bits in the aggregated bit block are encoded.

28. The network interface device of claim 25, wherein the PHY processing device is further configured to add at least one padding bit to the aggregated bit block before the bits in the aggregated bit block are encoded.

29. The network interface device of claim 28, wherein the PHY processing device is further configured to add cyclic redundancy check bits to the aggregated bit block before the bits in the aggregated bit block are encoded.

30. The network interface device of claim 25, further comprising a media access control layer (MAC) processing device configured to provide the plurality of bits to the PHY processing device.

* * * * *